(12) United States Patent
Smith et al.

(10) Patent No.: US 11,031,406 B2
(45) Date of Patent: Jun. 8, 2021

(54) SEMICONDUCTOR DEVICES HAVING SILICON/GERMANIUM ACTIVE REGIONS WITH DIFFERENT GERMANIUM CONCENTRATIONS

(71) Applicant: GLOBALFOUNDRIES U.S. Inc., Santa Clara, CA (US)

(72) Inventors: Elliot John Smith, Dresden (DE); Gunter Grasshoff, Radebeul (DE); Carsten Peters, Dresden (DE)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/416,477

(22) Filed: May 20, 2019

(65) Prior Publication Data

US 2019/0312042 A1    Oct. 10, 2019

Related U.S. Application Data

(62) Division of application No. 15/944,885, filed on Apr. 4, 2018, now Pat. No. 10,522,555.

(51) Int. Cl.
| | | |
|---|---|---|
| *H01L 27/092* | (2006.01) | |
| *H01L 27/11* | (2006.01) | |
| *H01L 21/02* | (2006.01) | |
| *H01L 21/311* | (2006.01) | |

(52) U.S. Cl.
CPC ...... *H01L 27/1108* (2013.01); *H01L 27/1116* (2013.01); *H01L 21/0262* (2013.01); *H01L 21/02236* (2013.01); *H01L 21/02532* (2013.01); *H01L 21/02639* (2013.01); *H01L 21/31111* (2013.01)

(58) Field of Classification Search
CPC ............ H01L 27/0922; H01L 27/1108; H01L 27/1116; H01L 27/1222; H01L 27/7378; H01L 29/0847; H01L 29/66651
See application file for complete search history.

(56) References Cited

U.S. PATENT DOCUMENTS

| | | | |
|---|---|---|---|
| 6,709,912 B1 | 3/2004 | Ang et al. | |
| 7,138,310 B2 | 11/2006 | Currie et al. | |
| 7,566,606 B2 | 7/2009 | Currie et al. | |
| 7,750,338 B2 | 7/2010 | Wang | |
| 8,987,069 B1 * | 3/2015 | Adam | ............... H01L 21/02664 438/149 |
| 2008/0014721 A1 | 1/2008 | Bauer | |
| 2009/0294801 A1 | 12/2009 | Harley et al. | |
| 2010/0240186 A1 | 9/2010 | Wang | |
| 2012/0153401 A1 * | 6/2012 | Javorka | ........... H01L 21/823807 257/392 |

FOREIGN PATENT DOCUMENTS

WO        03/105204 A2    12/2003

* cited by examiner

*Primary Examiner* — Hoai V Pham
(74) *Attorney, Agent, or Firm* — Francois Pagette; Hoffman Warnick LLC

(57) ABSTRACT

A semiconductor device includes a first transistor element having a first channel region and a second transistor element having a second channel region, wherein the first channel region includes a first crystalline silicon/germanium (Si/Ge) material mixture having a first germanium concentration, and wherein the second channel region includes a second crystalline Si/Ge material mixture having a second germanium concentration that is higher than the first germanium concentration.

20 Claims, 10 Drawing Sheets

SEMICONDUCTOR DEVICES HAVING SILICON/GERMANIUM ACTIVE REGIONS WITH DIFFERENT GERMANIUM CONCENTRATIONS

BACKGROUND

Field of the Disclosure

Generally, the present disclosure relates to semiconductor devices including advanced transistor elements formed on the basis of a crystalline semiconductor material, wherein at least some of the transistors may require a crystalline silicon/germanium (Si/Ge) material in order to meet respective performance characteristics.

Description of the Related Art

The fabrication of advanced integrated circuits, such as CPUs, storage devices, ASICs (application-specific integrated circuits), systems on a chip (SoC) and the like, requires a large number of circuit elements to be formed on a given chip area according to a specified circuit layout. In presently available complex integrated circuits, field effect transistors represent one important type of circuit element that mainly determines the performance of the integrated circuits.

Generally, a plurality of process technologies are currently available for forming field effect transistors, wherein, for many types of complex circuitry, CMOS technology is one of the most promising approaches due to the superior characteristics in view of operating speed and/or power consumption and/or cost efficiency. When producing complex integrated circuits using, for instance, CMOS technology, millions of transistors, i.e., N-channel transistors and P-channel transistors, are formed on a common substrate that includes a crystalline semiconductor layer. Due to superior availability and the immense experience gathered during the past decades in forming semiconductor devices, crystalline silicon material is the mostly used semiconductor base material for forming complex integrated circuits.

Generally, a field effect transistor, irrespective of whether an N-channel transistor or a P-channel transistor is considered, typically includes so-called "drain" and "source" regions, usually provided in the form of a highly doped semiconductor material, possibly in combination with a highly conductive metal-containing material, such as a metal silicide. The drain and source regions are laterally separated by a channel region, the conductivity of which may be controlled on the basis of an appropriate electric field established on the basis of a control electrode, typically referred to as a gate electrode structure. That is, the electric control field may be established on the basis of an electrode material of the gate electrode structure, which is separated from the channel region by a thin insulating layer, a so-called "gate" dielectric layer. Typically, the conductivity of the channel region, upon forming a conductive channel due to the application of an appropriate control voltage to the gate electrode structure, depends on, among other things, the dopant concentration in the channel region, the mobility of the charge carriers and, for a given extension of the channel region along the transistor width direction, on the distance between the source and drain regions, also referred to as the channel length. Since the conductivity of the channel region may substantially influence the finally obtained performance of a field effect transistor, great efforts have been made to improve the various factors affecting the channel conductivity. For example, reducing the channel length of transistor elements to be provided in time-critical signal paths has not only contributed to superior performance due to a reduced switching speed, but has also enabled the implementation of increased packing density, which is of great importance with respect to integrating more and more functions into a single semiconductor chip.

In other developments for forming transistor elements of superior performance, charge carrier mobility in the channel regions may be specifically engineered, for instance, by generating a certain type of strain, providing a specific material composition and the like. For example, since P-type transistors may basically have reduced charge carrier mobility in silicon compared to N-type transistor elements, respective measures may be taken so as to balance the difference in charge carrier mobility, at least to a certain degree, by appropriately engineering specific device parameters. For example, an Si/Ge mixture or alloy may be frequently provided in the drain and source regions of P-type transistor elements in order to address the above-mentioned differences in charge carrier mobility. Moreover, the Si/Ge material may also be formed within the channel region to achieve superior threshold voltage adjustment, since, in highly sophisticated semiconductor devices, threshold voltage adjustment may typically require additional measures in addition to providing appropriately designed gate electrode structures. Therefore, in many approaches, an appropriate Si/Ge material may be provided in at least some areas, which may, for instance, correspond to future active regions of the P-type transistor elements, which may be accomplished by applying selective epitaxial growth techniques for depositing an appropriate crystalline Si/Ge material.

A corresponding incorporation of a crystalline Si/Ge material may be accomplished prior to actually laterally delineating respective active regions by exposing respective areas of a base silicon-containing semiconductor layer and forming thereon the desired Si/Ge material. Although these techniques may address many of the demands for forming sophisticated integrated circuits, it, nevertheless, turns out that, upon further scaling the dimensions of integrated circuits, a single type of crystalline Si/Ge material may no longer suffice to meet the requirements of transistor elements of different threshold voltage requirements, different performance characteristics and the like. For example, in moderately complex integrated circuits, circuit portions are typically required in which information has to be temporarily stored, for instance, in a static RAM (random access memory) circuit portion, while, in other areas of the integrated circuit, increased switching speed and superior current-carrying capacity may be required. Consequently, due to the very different performance requirements for transistor elements to be implemented in RAM cells compared to transistor elements to be positioned in logic paths of the semiconductor device, it has proven to be very difficult to obtain desired transistor performance for transistor elements, for instance, to be used in RAM cells, and transistor elements to be used in time-critical signal paths on the basis of the same Si/Ge material.

In view of the situation described above, the present disclosure relates to semiconductor devices and manufacturing techniques in which active regions of some transistor elements may be formed on the basis of a crystalline Si/Ge material, while avoiding or at least reducing the effects of one or more of the problems identified above.

SUMMARY

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is based on the concept that performance requirements for transistor elements that may have to be formed on the basis of an active region, including an Si/Ge mixture, may be more appropriately addressed by providing a crystalline Si/Ge material or mixture or alloy in different active regions with different characteristics. That is, the present disclosure relates to a technique in which at least two different types of active regions to be formed on the basis of a crystalline Si/Ge material may be provided, thereby addressing different performance requirements, since at least two different germanium concentrations may be obtained in the different active regions, which, in turn, may translate into different performance characteristics of respective transistor elements. For example, in some illustrative embodiments disclosed herein, to meet the performance requirements of transistor elements to be provided in circuit areas requiring less demanding current-carrying capacities, for instance, in densely packed device areas, such as RAM areas, respective active regions may be provided on the basis of a reduced germanium concentration of respective Si/Ge materials, while, in other device areas, an increased germanium concentration may be provided in respective active regions requiring an Si/Ge mixture so as to meet the performance requirements of transistor elements to be used in time-critical signal paths and the like. To this end, in addition to "standard" active regions formed on the basis of a crystalline silicon material, possibly containing carbon and the like, respective active regions may be formed in a selective manner with different germanium concentrations as may be required in different device areas.

One illustrative embodiment disclosed herein is directed to a semiconductor device that includes, among other things, a first transistor element having a first channel region, wherein the first channel region includes a first crystalline silicon/germanium (Si/Ge) material mixture having a first germanium concentration, and a second transistor element having a second channel region, wherein the second channel region includes a second crystalline Si/Ge material mixture having a second germanium concentration that is higher than the first germanium concentration.

In another exemplary embodiment of the present disclosure, a semiconductor device includes a substrate, a buried insulating layer positioned above the substrate, and a semiconductor material layer positioned above the buried insulating layer. Additionally, the disclosed semiconductor device further includes a first active region formed in the semiconductor material layer, wherein the first active region has a first region thickness and includes a first crystalline silicon/germanium (Si/Ge) material mixture having a first germanium concentration, and a first transistor element formed in and above the first active region. Furthermore, a second active region is formed in the semiconductor material layer, wherein the second active region has a second region thickness and includes a second crystalline Si/Ge material mixture having a second germanium concentration that is higher than the first germanium concentration, and a second transistor element is formed in and above the second active region.

In a further illustrative embodiment, a semiconductor device is disclosed that includes, among other things, a semiconductor-on-insulator (SOI) substrate comprising a base substrate material, a buried insulating layer positioned above the base substrate material, and a semiconductor material layer positioned above the buried insulating layer. The illustrative semiconductor device also includes a first active region formed in the semiconductor material layer, the first active region having a first region thickness and including a first crystalline silicon/germanium (Si/Ge) material mixture having a first germanium concentration, and a first transistor element formed in and above the first active region. Additionally, a second active region is formed in the semiconductor material layer, the second active region having a second region thickness that is substantially equal to or greater than the first region thickness and including a second crystalline Si/Ge material mixture having a second germanium concentration that is higher than the first germanium concentration by at least approximately 2-10 atomic percent, and a second transistor element is formed in and above the second active region. Moreover, a third active region is formed in the semiconductor material layer, the third active region having a third region thickness that is substantially the same as at least one of the first and second thicknesses, wherein the third active region includes a third crystalline material having a lower germanium concentration than the first and second germanium concentrations, and a third transistor element is formed in and above the third active region.

BRIEF DESCRIPTION OF THE DRAWINGS

The disclosure may be understood by reference to the following description taken in conjunction with the accompanying drawings, in which like reference numerals identify like elements, and in which.

Figure 1A:
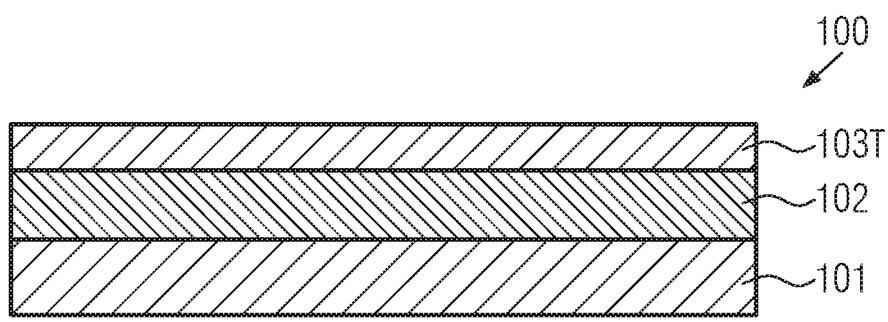
FIGS. 1A-1N schematically illustrate cross-sectional views of a semiconductor device during various manufacturing stages in forming active regions, including a crystalline Si/Ge mixture of different germanium concentration for at least two different types of active regions by applying an integrated process sequence, including a plurality of epitaxial growth processes, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the subject matter defined by the appended claims to the particular forms disclosed, but on the contrary, the intention is to cover all modifications, equivalents, and alternatives falling within the spirit and scope of the claimed subject matter.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As used in this description and in the appended claims, the terms "substantial" or "substantially" are intended to conform to the ordinary dictionary definition of that term, meaning "largely but not wholly that which is specified." As such, no geometrical or mathematical precision is intended by the use of terms such as "substantially flat," "substantially perpendicular," "substantially parallel," "substantially circular," "substantially elliptical," "substantially rectangular," "substantially square," "substantially aligned," and/or "substantially flush," and the like. Instead, the terms "substantial" or "substantially" are used in the sense that the described or claimed component or surface configuration, position, or orientation is intended to be manufactured, positioned, or oriented in such a configuration as a target. For example, the terms "substantial" or "substantially" should be interpreted to include components and surfaces that are manufactured, positioned, or oriented as close as is reasonably and customarily practicable within normally accepted tolerances for components of the type that are described and/or claimed. Furthermore, the use of phrases such as "substantially conform" or "substantially conforms" when describing the configuration or shape of a particular component or surface, such as by stating that "the configuration of the component substantially conforms to the configuration of a rectangular prism," should be interpreted in similar fashion.

Furthermore, it should be understood that, unless otherwise specifically indicated, any relative positional or directional terms that may be used in the descriptions set forth below—such as "upper," "lower," "above," "below," "over," "under," "top," "bottom," "vertical," "horizontal," "lateral," "level with," "offset from," and the like—have been included so as to provide additional clarity to the description, and should be construed in light of that term's normal and everyday meaning relative to the depiction of the components or elements in the referenced figures. For example, referring to the cross-sectional view of the in-process device depicted in FIG. 1D, it should be understood that the etch mask 106 is depicted as being positioned "above" the hard mask layer 105, and the buried insulating layer 102 is depicted as being positioned "below" the semiconductor layer 103 and "above" the substrate material 101. Additionally, the "top" or "upper" surface of the semiconductor layer 103 as shown in FIG. 1D is depicted as being substantially "horizontally" oriented, and in the cross-sectional view of FIG. 1N, the active region 114B is shown as extending "above" the "top" or "upper" surface of the semiconductor layer 103, and the "top" or "upper" surface of the active region 114A is shown as being substantially "level with" the "top" or "upper" surface of the adjacent active region 114C formed in the semiconductor layer 103. However, it should be understood that such descriptions are for reference only based on how the various elements are arranged relative to one another as shown in the figures, and therefore should not be construed as limiting in any way on how the depicted structures or components might actually be oriented during manufacture, assembly, and/or use.

As previously discussed, in sophisticated semiconductor devices, a plurality of different functional circuit portions may typically have to be implemented in a single semiconductor chip, thereby typically imposing different performance needs on transistor elements to be formed in these various different circuit portions. On the other hand, since the various different transistor elements may typically have to be formed on the basis of one and the same manufacturing platform and by process techniques in which as many process steps as possible may have to be commonly performed for as many different transistor types as possible in order to reduce overall manufacturing costs, a basic configuration of respective transistor elements may typically have to be implemented and may have to be (slightly) modified so as to reflect the different performance characteristics.

For example, in sophisticated semiconductor devices, different approaches have been taken so as to continue further device scaling of transistor elements, for instance, by implementing three-dimensional transistor architectures or implementing planar transistor elements on the basis of a fully depleted transistor configuration by using an extremely thin silicon-based initial semiconductor material. Frequently, an SOI (semiconductor- or silicon-on-insulator) architecture may be applied so as to enhance overall performance of transistor elements even further, by implementing additional mechanisms for controlling the current flow through the respective channel region based on the SOI architecture. In combination with sophisticated gate electrode structures providing a high capacitive coupling to the channel region, additional measures may typically have to be taken so as to appropriately adjust transistor characteristics in the form of threshold voltage and the like. To this end, in particular, P-type transistor elements have been formed on the basis of an active region including an Si/Ge mixture, which may result in superior performance characteristics and additional flexibility in adjusting threshold voltages. Since respective transistor characteristics of P-type transistors may, however, be different in different device areas, in particular when highly scaled semiconductor devices are considered, the present disclosure provides concepts in which Si/Ge mixtures of different germanium concentrations may be provided with a high degree of compatibility with sophisticated conventional manufacturing techniques. In this manner, for basically the same transistor configuration, an additional degree of freedom for adjusting transistors characteristics may be accomplished.

It should be appreciated that the techniques as discussed above and as will be described later on in more detail may be highly advantageous in the context of sophisticated transistor elements formed on the basis of a fully depleted planar transistor architecture, wherein, if considered appropriate, an SOI architecture may also be applied. For example, respectively different Si/Ge-based active regions may be required in densely packed device areas, such as static RAM areas in which minimum lateral dimensions of active regions may be 60 nm and even significantly less, while, in other device areas, active regions including Si/Ge mixtures of increased germanium concentration may be advantageous in obtaining the desired transistor performance.

In other illustrative embodiments, the principles disclosed herein may also be applied to other device architectures, for example, three-dimensional transistor configurations, semiconductor devices including planar transistor elements of less critical lateral dimensions and the like.

FIG. 1A schematically illustrates a cross-sectional view of a semiconductor device 100 in an early manufacturing stage. That is, the semiconductor device 100 may include a substrate or substrate material 101, which may be provided in the form of any appropriate carrier material, such as crystalline silicon, crystalline germanium or an insulating material having formed thereon a crystalline semiconductor material, such as crystalline silicon. Moreover, as discussed above, in some illustrative embodiments, the semiconductor device 100 may receive transistor elements formed on the basis of an SOI architecture and, thus, a buried insulating layer 102 may be provided, at least in certain areas of the semiconductor device 100. The buried insulating layer 102 may have any appropriate configuration in terms of material composition and layer thickness. For example, well-established standard dielectric materials, such as silicon dioxide, silicon nitride and silicon oxynitride, may be included in the layer 102, while, in other cases, in addition to or alternative to these standard materials, high-k dielectric materials, possibly in a ferroelectric phase, may also be implemented in the layer 102, if considered appropriate.

Moreover, in the manufacturing stage shown, an initial silicon-containing semiconductor layer 103T may be provided, wherein the layer 103T may typically represent a crystalline silicon layer, possibly including weak doping in this manufacturing stage, wherein a respective doping may be incorporated in a locally varying manner, if considered appropriate. In other cases, the basic silicon-containing semiconductor layer 103T may be provided in the form of a substantially intrinsic semiconductor material. As explained before, in some illustrative embodiments, an initial thickness of the semiconductor layer 103T may be approximately 15 nm and even less, when planar transistor elements have to be formed on the basis of a fully-depleted transistor configuration.

The semiconductor device 100 as shown in FIG. 1A may be formed in accordance with well-established process techniques, wherein, for instance, the substrate 101, possibly including the buried layer 102 and the initial semiconductor layer 103T, may be provided by a vendor of SOI substrates.

Figure 1B:
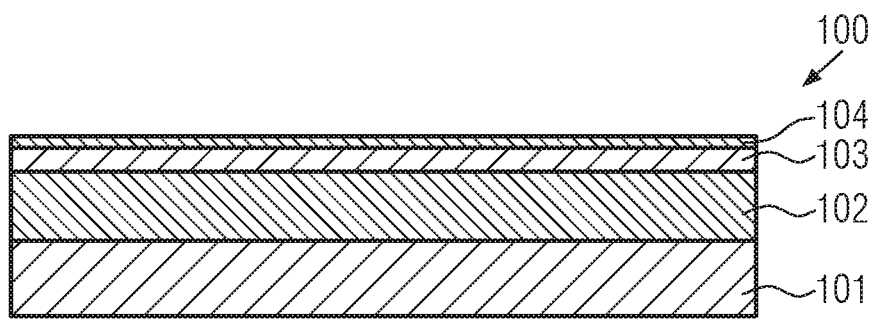

FIG. 1B schematically illustrates the semiconductor device 100 in a further advanced manufacturing stage in which the initial semiconductor layer 103T (FIG. 1A) may have been processed in view of a target thickness in order to provide a semiconductor layer 103 having an appropriate thickness for the further manufacturing process. For example, the initial layer 103T (FIG. 1A) may be thinned by any appropriate techniques, such as etch techniques, planarization techniques, oxidation and the like, in order to obtain a target thickness of, for instance, 10 nm and less, depending on the overall device requirements. Furthermore, in this manufacturing stage, a protective layer 104, for instance, provided in the form of a silicon dioxide material, having a thickness of approximately one to several nanometers, may be formed on the silicon-containing semiconductor layer 103, for instance, by oxidation and/or deposition.

Figure 1C:
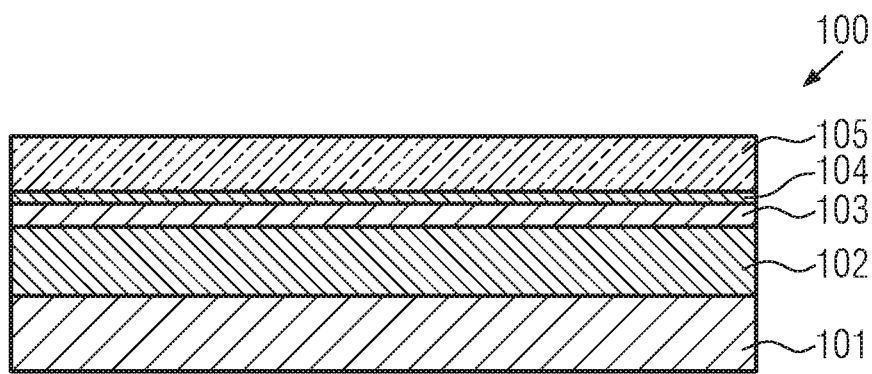
Figure 1D:
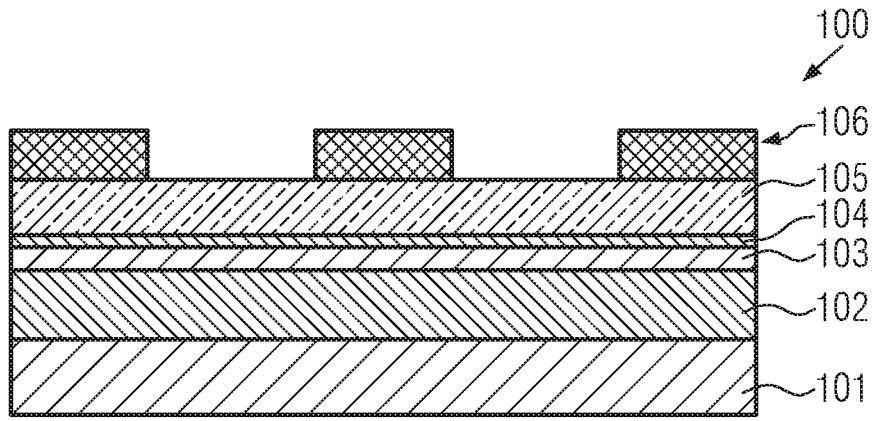

FIG. 1C schematically illustrates the semiconductor device 100 in a manufacturing stage in which a hard mask layer 105, for instance, in the form of a silicon nitride material or any other appropriate hard mask material, may be formed with appropriate thickness, for instance, in the range of approximately 10-50 nm, depending on the overall process requirements. The layer 105 may be formed by using well-established chemical vapor deposition (CVD) techniques.

FIG. 1D schematically illustrates the semiconductor device 100 after having formed thereon an etch mask 106, which may represent an appropriate mask pattern so as to delineate semiconductor regions in at least one lateral direction, i.e., in FIG. 1D, the horizontal direction, for coarsely defining the lateral position of semiconductor regions to be formed from the semiconductor layer 103. The etch mask 106 may include a resist material, a mask material of increased stability compared to a resist material, for instance in the form of silicon in amorphous or polycrystalline state, and the like, thereby providing sufficient etch selectivity with respect to the material of the layer 105. It should be appreciated that the etch mask 106 may be formed on the basis of well-established lithography techniques.

On the basis of the etch mask 106, a respective etch process or a sequence of etch processes may be applied in order to etch through the hard mask layer 105 while using the protective layer 104 as an etch stop material. For example, a plurality of well-established selective etch recipes are available and may be applied so as to transfer the pattern of the mask 106 into the underlying hard mask material 105.

Figure 1E:
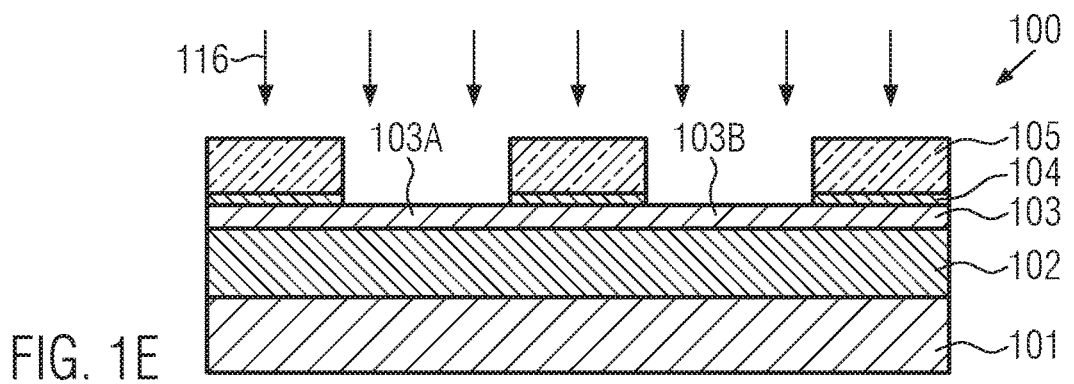

FIG. 1E schematically illustrates the semiconductor device 100 in a further advanced manufacturing stage. As illustrated, the hard mask layer 105 may be patterned into an etch mask, as discussed above with reference to FIG. 1D, and may be subsequently subjected to a further etch process 116, which may be a continuation of the previously described process sequence or which may be a dedicated etch or cleaning process for removing exposed portions of the protective layer 104. Consequently, based on the etch and/or cleaning process 116, portions of the semiconductor layer 103 may be exposed. For example, a first region 103A may be exposed and may represent a portion of the semiconductor layer 103 which may receive an Si/Ge mixture of reduced germanium concentration, while a second region 103B may represent a region for forming therein and thereon an Si/Ge mixture having a germanium concentration that is higher compared to the target germanium concentration in the region 103A.

It should be appreciated that the process 116 may also include respective process steps for preparing the exposed surface areas of the regions 103A, 103B for a subsequent deposition or growth of a crystalline Si/Ge material.

Figure 1F:
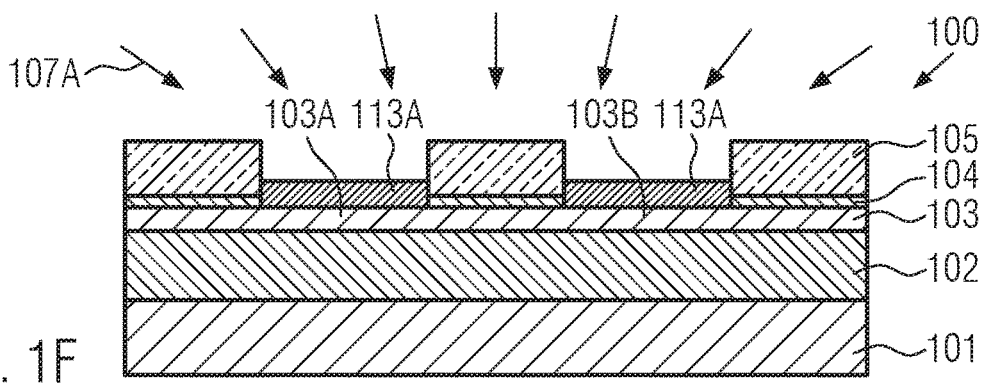

FIG. 1F schematically illustrates the semiconductor device 100 when exposed to a deposition ambient of a process 107A in which appropriate conditions are established so as to deposit a desired semiconductor material selectively on exposed surface portions of the semiconductor layer 103, i.e., on the regions 103A, 103B, while substantially suppressing significant deposition of semiconductor material on dielectric surface areas. To this end, well-established process recipes may be applied, wherein, in particular, the germanium concentration of the respective precursor material may be appropriately adjusted so as to grow a crystalline Si/Ge material 113A of desired germanium concentration on the regions 103A, 103B. In some illustrative embodiments, the growth or deposition process 107A may, thus, represent a process in which a "single" well-defined germanium concentration may be provided within the grown Si/Ge material 113A. In other illustrative embodiments, the deposition parameters may be changed during the process 107A, thereby implementing a specific "vertical" germanium concentration, if considered appropriate. Moreover, a thickness of the grown Si/Ge material 113A may be controlled, for instance, by selecting an appropriate deposition time. For example, the resulting thickness of the grown Si/Ge material 113A may be comparable to the initial thickness of the semiconductor layer 103.

Figure 1G:
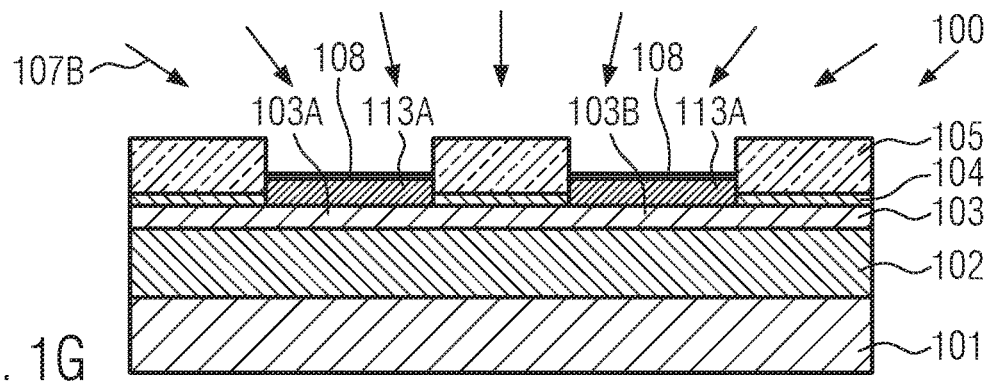

FIG. 1G schematically illustrates the semiconductor device 100 during a further epitaxial growth process 107B according to some illustrative embodiments in which an intermediate semiconductor layer, such as a substantially pure silicon layer 108, may be formed. For example, after having reached a desired target thickness for the material 113A during the process 107A in FIG. 1F, supply of the respective germanium-containing precursor material may be, e.g., substantially reduced in the respective deposition ambient and, therefore, the layer 108 may be formed with high silicon concentration.

Figure 1H:
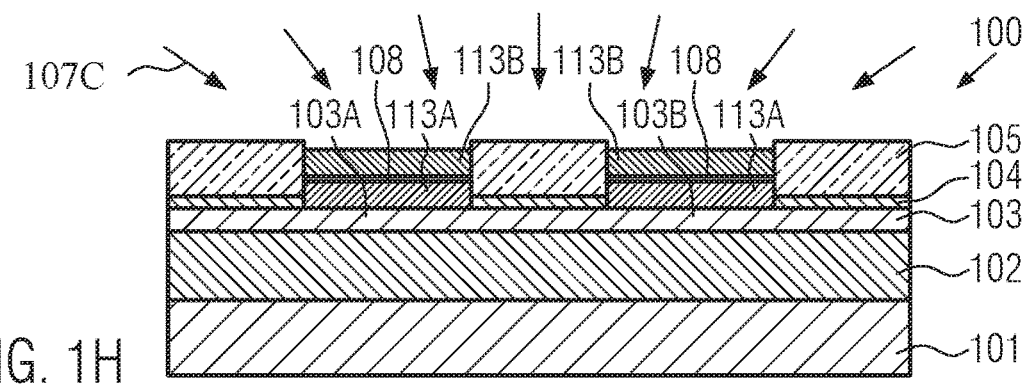

FIG. 1H schematically illustrates the semiconductor device 100 during a further growth process 107C in which a further Si/Ge material 113B may be selectively grown on the previously formed layer or layers 113A, 108. To this end, appropriate deposition parameters may be used in order to obtain the second Si/Ge material 113B with appropriate germanium concentration and thickness. In some illustrative embodiments, the germanium concentration of the material 113B may be greater than the germanium concentration in the material 113A.

It should be appreciated that appropriate process parameters for the growth processes 107A, 107B, 107C may be readily determined in advance, for instance, by experiments, in order to obtain the first and second Si/Ge materials 113A, 113B with desired germanium concentration and thickness. In some illustrative embodiments, the processes 107A, 107B, 107C may be performed in the form of an integrated deposition regime in which the different materials may be deposited in a sequence of deposition steps without having to break the vacuum conditions in between or initiate any substrate transport activities and the like. In some illustrative embodiments, the material 113A, the material 108 and the material 113B may be provided as substantially distinct material layers having a specified material composition, i.e., a specified germanium concentration and a respective layer thickness. In other illustrative embodiments, a more or less gradual variation of the respective material characteristics may be accomplished during the sequence of processes 107A, 107B, 107C, for instance, by appropriately varying the precursor material or materials, thereby obtaining a more or less gradually varying germanium concentration. In any such embodiments, at least the layers 113A, 113B may be provided with a vertically varying germanium concentration, while the layer 108 may be provided or not, depending on the overall requirements.

Figure 1I:
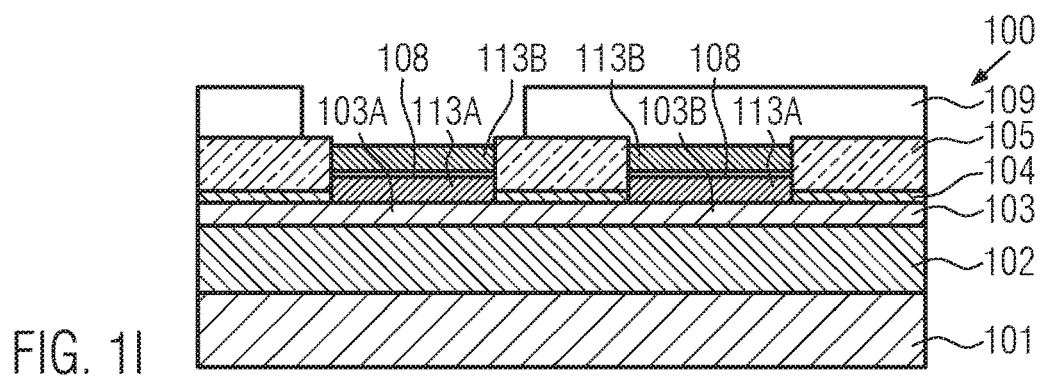

FIG. 1I schematically illustrates the semiconductor device 100 in a further advanced manufacturing stage in which a mask 109 may be formed so as to expose the material 113B in certain device areas. For example, the mask 109 may expose areas of the semiconductor device 100 which correspond to device areas in which active regions based on Si/Ge material may be provided with reduced germanium concentration. In some illustrative embodiments, the mask 109 may expose the area of a static RAM region of the semiconductor device 100. The mask 109 may be formed on the basis of well-established lithography techniques, for instance, providing the mask 109 in the form of a resist material, a polymer material, a hard mask material and the like.

Figure 1J:
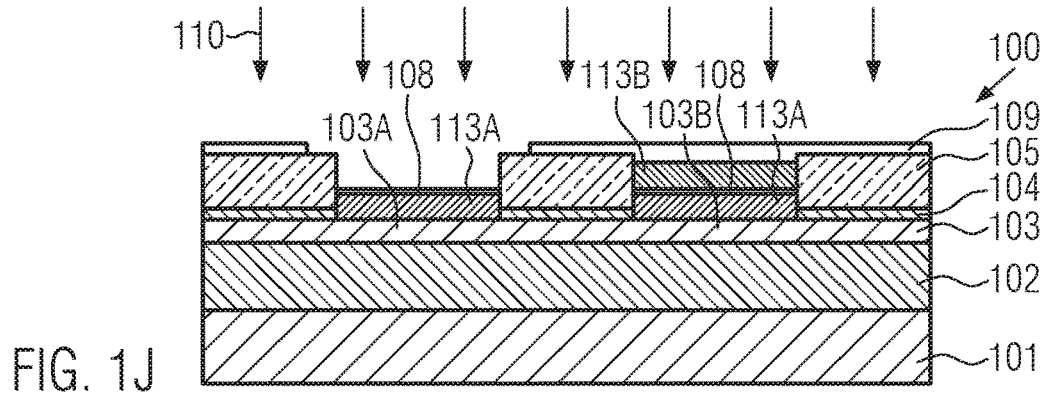

FIG. 1J schematically illustrates the semiconductor device 100 during an etch process or sequence 110 performed on the basis of etch recipes for selectively etching germanium-containing silicon material with respect to the patterned hard mask layer 105. Moreover, the etch recipe 110 is typically selected so as to provide for a certain etch selectivity with respect to the mask 109, thereby ensuring reliable coverage of the material 113B provided above the region 103B, while continuously removing the material 113B from above the region 103A. For example, the layer 108, if provided, may result in certain stop capabilities for the etch process 110.

Figure 1K:
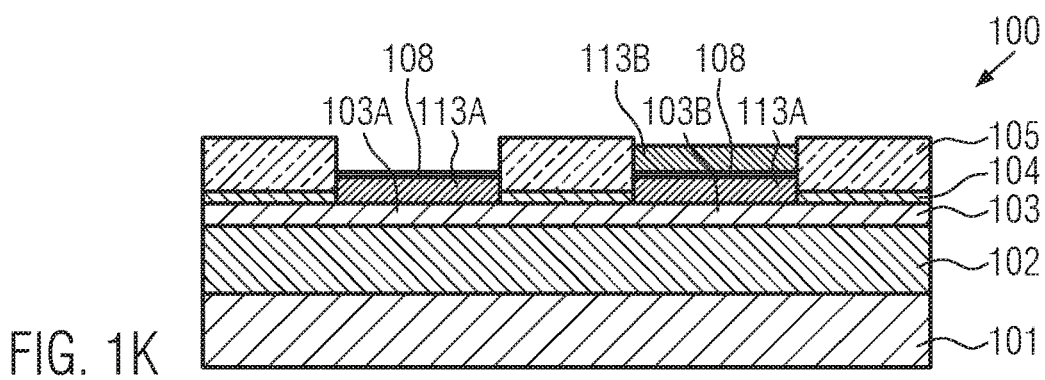

FIG. 1K schematically illustrates the semiconductor device 100 after the removal of the residues of the mask 109 (see FIG. 1J), thereby exposing the material 113A, possibly in combination with the layer 108, above the region 103A and the second material 113B above the region 103B. The removal of any material residues may be accomplished on the basis of appropriate process recipes.

Figure 1L:
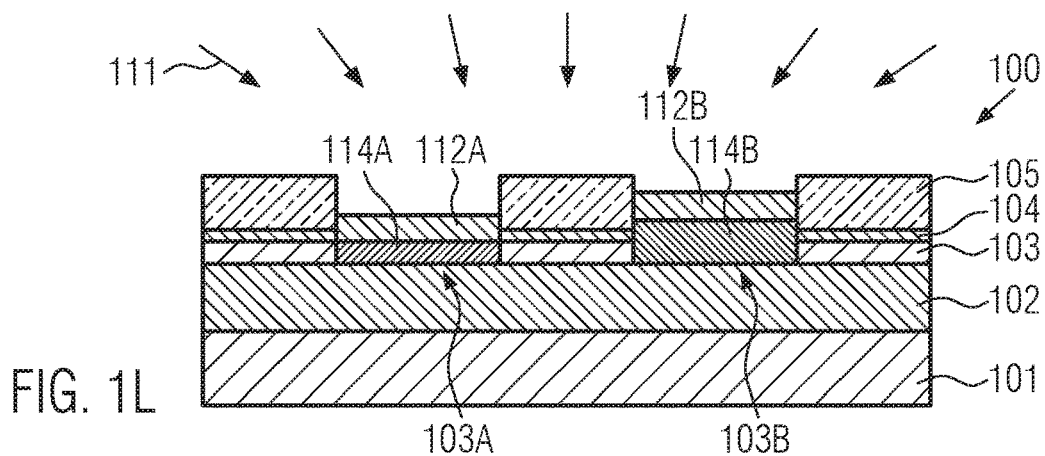

FIG. 1L schematically illustrates the semiconductor device 100 in a further advanced manufacturing stage. As illustrated, an oxidizing ambient 111 may be established by selecting an appropriate atmosphere and establishing a desired temperature, for instance, in the range of several hundred degrees Celsius, for instance, approximately 800-

1200° C. or even higher, depending on the overall requirements. Consequently, during the process 111 performed in an oxidizing ambient, oxide materials 112A, 112B may be increasingly formed from the materials 113A, 113B, respectively (see FIG. 1K), thereby increasingly "driving" germanium species into the lower lying regions, since the silicon species may preferably take part in the oxidation process. Consequently, the germanium species is "condensed" within the lower lying regions and an increased overall germanium concentration may be obtained within the initial silicon-based regions 103A, 103B. In one illustrative embodiment, the at least one oxidation process 111 is performed in such a manner that a post-oxidation first germanium concentration of the first crystalline silicon/germanium (Si/Ge) material 113A is different from a post-oxidation second germanium concentration of the second crystalline Si/Ge material 113B. In an even more specific illustrative embodiment, performing the at least one oxidation process 111 increases the pre-oxidation germanium concentrations in both of the materials 113A, 113B. Additionally, at the completion of the oxidation process 111, the materials 113A, 113B have, respectively, first and second post-oxidation germanium concentrations that are different from one another. In one particular example, after performing the at least one oxidation process 111, the second post-oxidation germanium concentration may be greater than the first post-oxidation germanium concentration.

Due to the presence of the material 113B having an increased germanium concentration compared to the material 113A (see FIG. 1K), an increased germanium migration into the material 103B may be accomplished, thereby obtaining an increased germanium concentration in the region 103B compared to the region 103A. Consequently, respective active regions 114A may be obtained on the basis of the region 103A having a desired germanium concentration of, for instance, approximately 10-18 atomic (at) %, while respective active regions 114B may be obtained on the basis of the region 103B with a higher germanium concentration, for instance, in the range of approximately 19-30 at %. For example, in some illustrative embodiments a difference in Ge-concentration between the regions 103A, 103B may range from approximately 2 at % to 10 at %, that is, the germanium concentration in the region 103B may be higher by 2 at % to 10 at % compared to the region 103A. It is to be noted that the corresponding germanium concentrations may be varied in other illustrative embodiments depending on the specific device requirements.

Moreover, it should be appreciated that the "active regions" 114A, 114B may not actually be delineated in the lateral directions and may merely represent "coarsely" defined areas of active regions, in and above which respective transistor elements may have to be formed after actually laterally delineating and thus precisely dimensioning these active regions 114A, 114B.

Figure 1M:
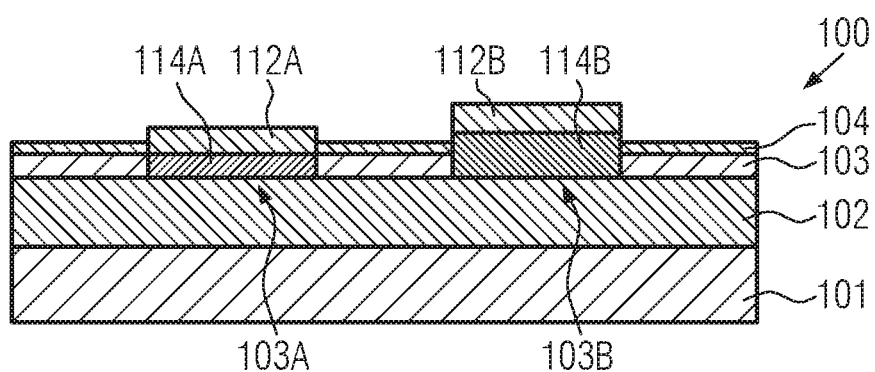

FIG. 1M schematically illustrates the semiconductor device 100 after the removal of the patterned hard mask layer 105 (see FIG. 1L), which may be accomplished on the basis of appropriately designed etch recipes. Respective recipes are well known in the art, for instance, for removing silicon nitride material selectively with respect to silicon oxide material. Consequently, during the respective removal process, the active regions 114A, 114B and the remaining semiconductor layer 103 may be reliably protected by the layer 104 and the oxide portions 112A, 112B.

Next, the layer 104 and the oxide materials 112A, 112B may be removed, for instance, by highly selective etch recipes, for instance, wet chemical etch recipes, which are well established in the art.

Figure 1N:
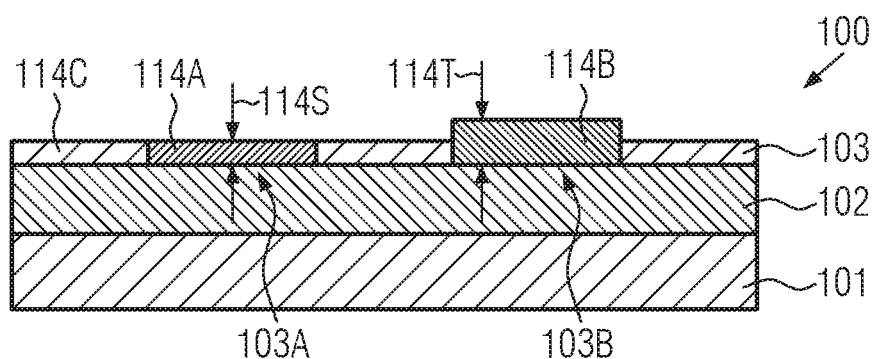

FIG. 1N schematically illustrates the semiconductor device 100 after the above-described process sequence. That is, the device 100 may include the active region 114A having the low germanium concentration, as discussed above, and the active region 114B having the high germanium concentration, wherein, due to the previous processing, a thickness 114T of the active region 114B may be greater compared to a thickness 114S of the active region 114A. Furthermore, as illustrated, respective "active regions" 114C may be present and may represent the remaining areas of the semiconductor layer 103, which may have remained covered by the patterned hard mask layer 105 and layer 104 (see FIGS. 1L and 1M, respectively) during the above-described processing.

Thereafter, the further processing may continue by performing implantation processes for incorporating appropriate dopant species into the layer 103 and in the substrate material 101, if required, while, prior to the corresponding process sequence and/or after the process sequence, the active regions 114A, 114B, 114C may actually be laterally delineated so as to obtain the desired target lateral dimensions for forming respective transistor elements thereon and therein. To this end, well-established process strategies may be applied on the basis of sophisticated lithography and patterning strategies so as to form respective isolation regions (not shown), which may, thus, result in the actual lateral dimensions of the initially provided active regions 114A, 114B, 114C, as will be discussed later on in more detail with reference to FIGS. 4A and 4B.

With reference to FIGS. 2A-2L, further illustrative embodiments will now be described in more detail, wherein reference may also be made to FIGS. 1A-1N, if appropriate.

Figure 2A:
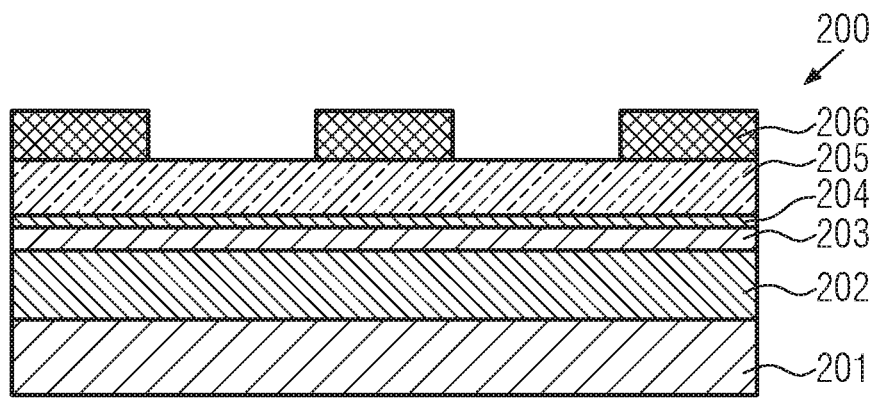
FIGS. 2A-2L schematically illustrate cross-sectional views of a semiconductor device during various manufacturing stages in forming active regions, including Si/Ge mixtures of different germanium concentration, by applying separate epitaxial growth processes, according to illustrative embodiments.

FIG. 2A schematically illustrates a cross-sectional view of a semiconductor device 200 in a manufacturing stage which may basically correspond to the manufacturing stage of the semiconductor device 100 as shown in FIG. 1D. Consequently, in this stage, the semiconductor device 200 may include a substrate 201, an optional buried insulating layer 202, a silicon-containing semiconductor layer 203, a protective layer 204, a hard mask layer 205 and an etch mask 206. With respect to these components, it is to be noted that the same criteria may apply as, for instance, discussed above in the context of the semiconductor device 100. That is, the semiconductor layer 203 may have a thickness appropriate for forming transistor elements thereon and therein, as discussed above, and the protective layer 204, for instance, provided in the form of silicon dioxide, followed by the hard mask layer 205, may be used during the further processing for implementing an Si/Ge mixture in areas of the semiconductor layer 203 as specified by the etch mask 206. As discussed above, the etch mask 206 may include any appropriate material or materials having sufficient etch selectivity so as to pattern the hard mask layer 205. As explained above, the etch mask 206 may coarsely define the lateral position and size of active regions still to be formed, wherein the actual target dimensions may be defined in these areas on the basis of isolation regions to be formed in a later manufacturing stage.

Figure 2B:
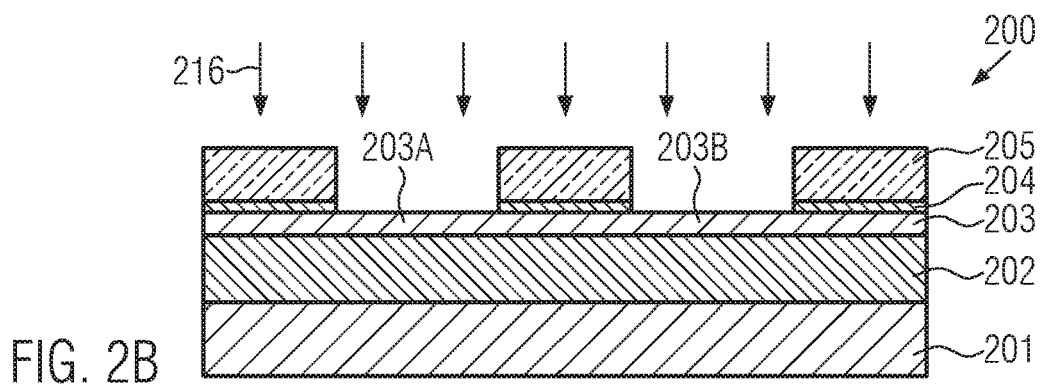

FIG. 2B schematically illustrates the semiconductor device 200 during an etch process or a sequence of processes 216 in which the hard mask layer 205 may be patterned in accordance with the etch mask 206 (see FIG. 2A), while using the layer 204 as an etch stop material. Thereafter, the process or sequence 216 may include a further etch process for removing exposed portions of the layer 204, thereby exposing a first region 203A and a second region 203B of the semiconductor layer 203, as also discussed above. It should further be appreciated that the process or sequence 216 may also include any processes for preparing the exposed surface areas of the regions 203A, 203B for the growth of an Si/Ge material.

Figure 2C:
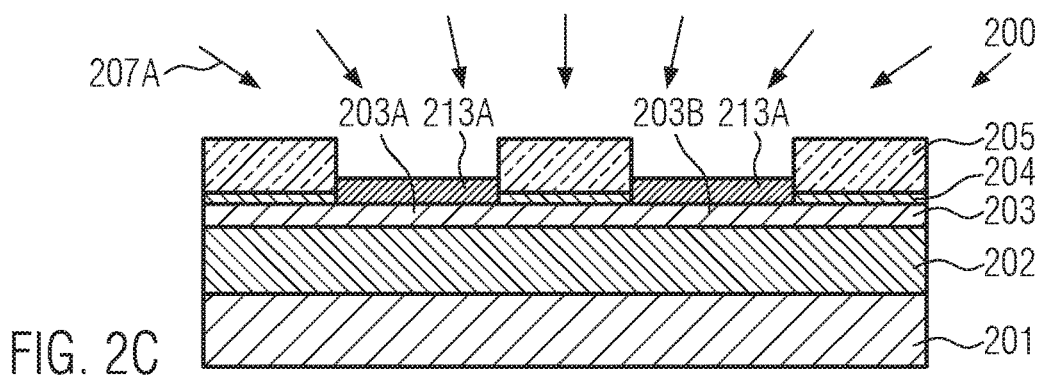

FIG. 2C schematically illustrates the semiconductor device 200 during a corresponding growth or deposition process 207A in which a first Si/Ge material 213A may be selectively grown on the regions 203A, 203B. Regarding any process techniques and process recipes, reference may also be made to the process 107A described in the context of FIG. 1F. Thus, in some illustrative embodiments, the first Si/Ge mixture or material 213A may be provided with a reduced germanium concentration so as to obtain a desired final germanium concentration in the region 203A, as also discussed above. If considered appropriate, a concentration gradient may be established in the first Si/Ge material 213A by appropriately controlling respective process parameters, as also discussed above.

Figure 2D:
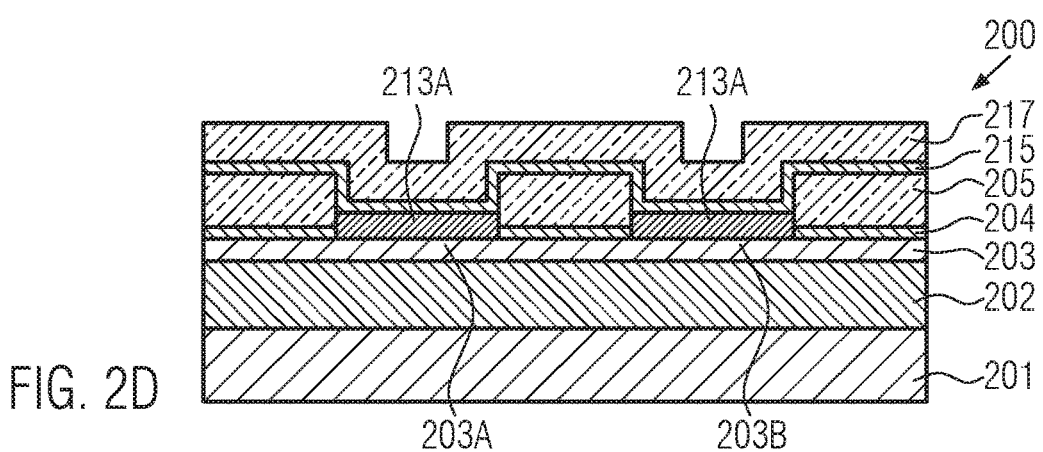

FIG. 2D schematically illustrates the semiconductor device 200 in a further advanced manufacturing stage. As illustrated, an etch stop liner 215 may be formed above the patterned layer 205 and the material 213A, followed by a further hard mask layer 217. For example, the layers 215, 217 may be provided in the form of silicon dioxide and silicon nitride, while, in other cases, any other appropriate material system may be used as long as the respective etch selectivity for the further process sequence may be achieved. The layers 215 and 217 may be formed on the basis of well-established deposition techniques, as are well known in the art. Similarly, a respective thickness of the layers 215, 217 may be selected in view of the further process sequence, and appropriate thickness values may be readily determined on the basis of experiments and the like.

Figure 2E:
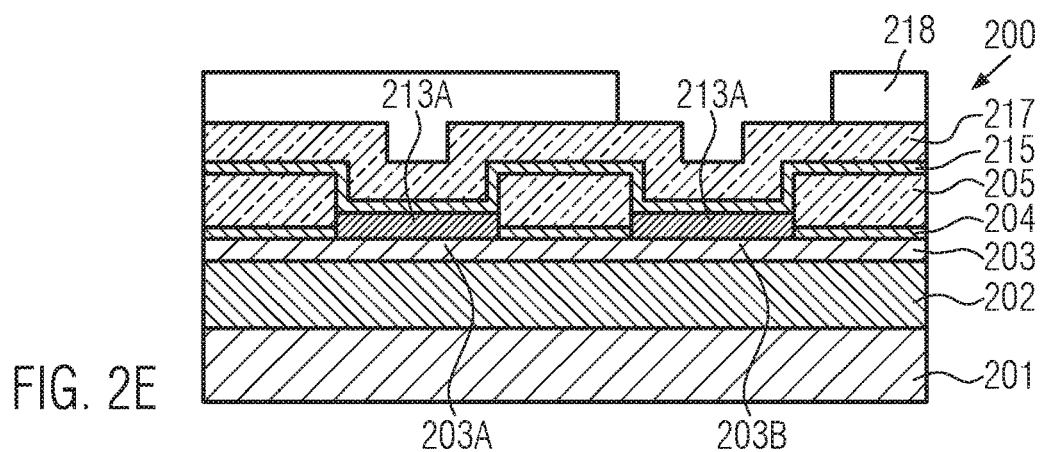

FIG. 2E schematically illustrates the semiconductor device 200 with a further etch mask 218 formed above the hard mask layer 217. The etch mask 218 may be formed on the basis of resist material, polymer material or any other hard mask material which may allow an efficient patterning of the hard mask layer 217. As illustrated, the etch mask 218 may be patterned such that the region 203B may be exposed, while other areas are covered by the material of the mask 218. As is shown, the lateral position and the lateral dimensions of the openings of the mask 218 are non-critical as long as the area of the region 203B is sufficiently exposed by the mask 218.

Figure 2F:
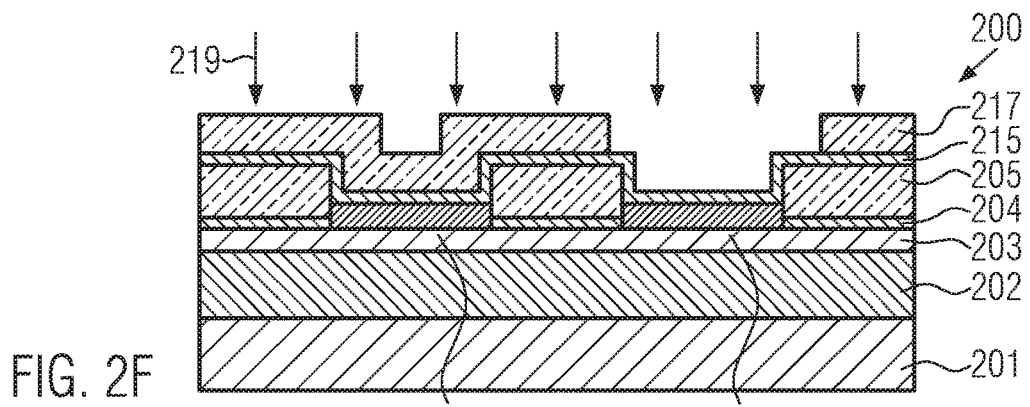

FIG. 2F schematically illustrates the semiconductor device 200 when being subjected to an etch process or sequence of etch processes 219, during which the hard mask layer 217 may be patterned on the basis of the etch mask 218 (see FIG. 2E). To this end, any well-established anisotropic etch recipes may be applied in which the etch stop layer 215 may reliably control the end of the patterning process 219. Consequently, the hard mask material of the layer 217 may be reliably removed from above the second region 203B, while the first region 203A, as well as any other regions of the semiconductor layer 203, may be still covered by the layer 217.

Figure 2G:
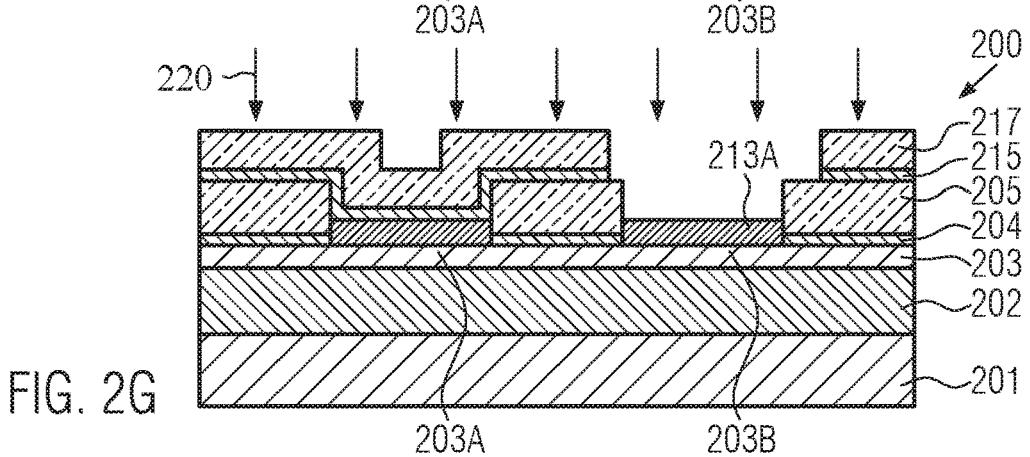

FIG. 2G schematically illustrates the semiconductor device 200 when exposed to a further etch process 220 that is designed so as to selectively remove exposed portions of the etch stop layer 215 with respect to the hard mask layer 217. For example, a plurality of wet chemical etch recipes and plasma-assisted etch recipes are available in the art for efficiently removing, for instance, silicon dioxide material selectively to silicon nitride material. Furthermore, the process 220 may also include any appropriate cleaning procedures for preparing an exposed surface of the first Si/Ge material 213A above the second region 203B for a further selective epitaxial growth process. On the other hand, the region 203A is reliably protected by the layers 215 and 217.

Figure 2H:
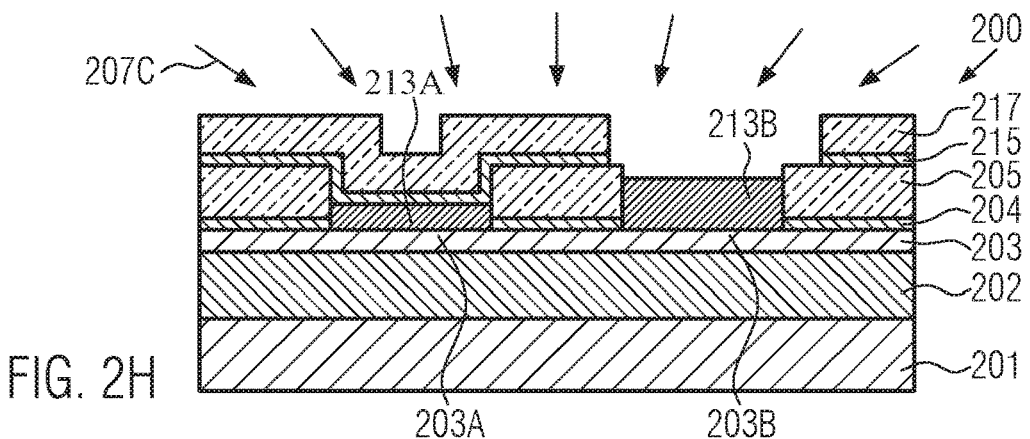

FIG. 2H schematically illustrates the semiconductor device 200 when exposed to a deposition ambient 207C for forming a second crystalline Si/Ge mixture 213B above the second region 203B. The material 213B may be formed on the previously grown material 213A (see FIG. 2G) and may, thus, in combination with this previously grown material, form in total the second Si/Ge material 213B.

As discussed above, the growth process 207C may be appropriately controlled in terms of germanium concentration and layer thickness in order to arrive at a desired target material composition above the region 203B. If desired, a germanium concentration gradient may be established by appropriately controlling one or more process parameters of the process 207C. In some illustrative embodiments, at least an upper portion of the material 213B may have a germanium concentration higher than that of the material 213A, previously grown during the process 207A (see FIG. 2C).

Thereafter, the processing may be continued by removing the patterned hard mask layer 217, for instance, by using well-established selective etch recipes, wherein the material of the layer 217 may be removed selectively with respect to the layer 215, while portions of the hard mask 205 that are not covered by the layer 215 may also be removed. Consequently, a respective material removal of the hard mask layer 205 may be taken into consideration upon setting the initial layer thickness thereof. Furthermore, when exposed to a respective etch ambient for removing the material 217, a certain degree of material erosion in the second Si/Ge mixture 213B may also occur and a corresponding "erosion" may be taken into consideration upon selecting a target thickness for the material 213B during the growth process 207C. On the other hand, the material 213A formed above the first region 203A may be reliably protected by the layer 215.

Figure 2I:
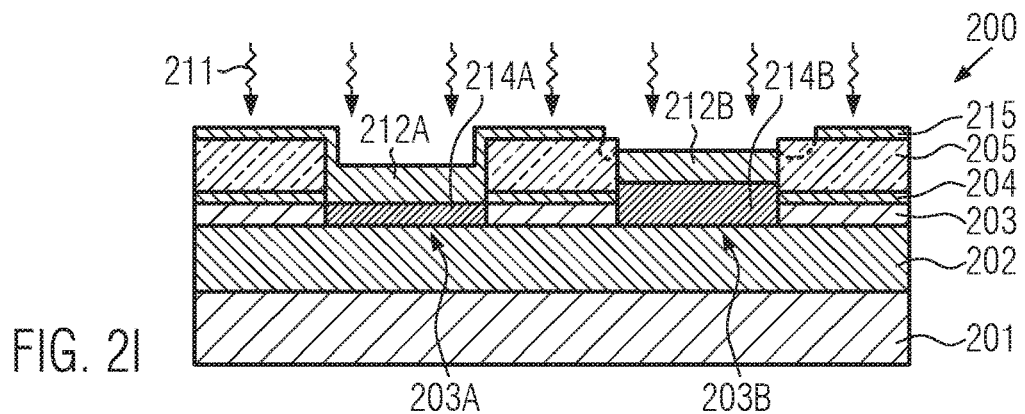

FIG. 2I schematically illustrates the semiconductor device 200 after completing the above-described sequence. It should be appreciated that the dashed lines may indicate portions of the hard mask layer 205 that may have been removed during the subsequent process. In this state, the device 200 is subjected to an oxidation process 211 in which preferably germanium species may be driven into the regions 203A, 203B by preferably forming silicon dioxide 212A, 212B above the regions 203A, 203B, respectively. Regarding any appropriate process parameters for the "condensation" process 211, the same criteria may apply as discussed previously in the context of the process 111 described in FIG. 1L.

Consequently, during the process 211, by continuingly oxidizing the previously provided Si/Ge materials, the regions 203A, 203B may be increasingly enriched with germanium species, thereby forming respective active regions 214A, 214B, wherein a germanium concentration of the active region 214A may be less compared to a germanium concentration of the active region 214B, as also discussed above. Moreover, it is to be noted that the "active regions" 214A, 214B may still need lateral delineation so as to be appropriate for forming transistor elements thereon and therein, as also explained above.

Figure 2J:
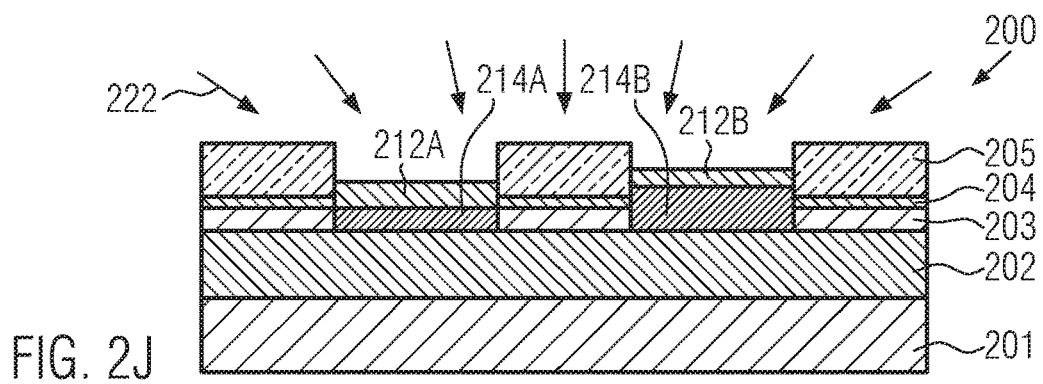

FIG. 2J schematically illustrates the semiconductor device 200 during a further etch process 222 in which the remaining material of the layer 215 (see FIG. 2I) may be removed selectively to the hard mask 205, which may be accomplished on the basis of a plurality of well-established etch recipes. During this process, the active regions 214A, 214B may remain covered, although material erosion of the materials 212A, 212B may occur during the process 222.

Figure 2K:
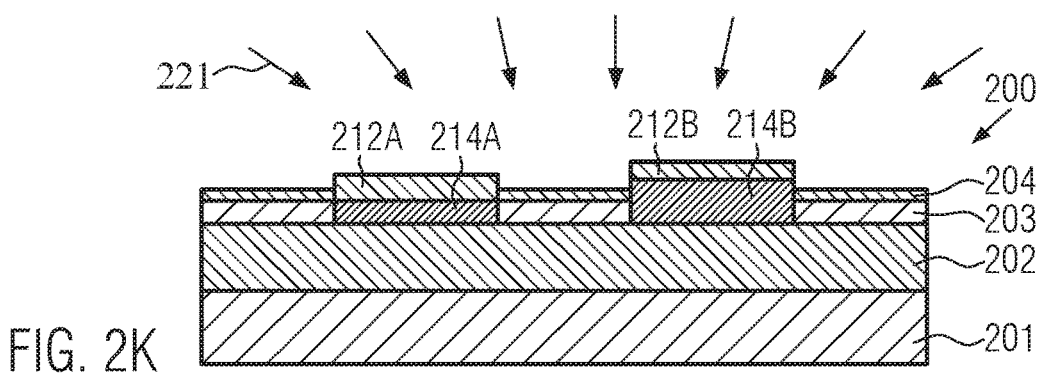

FIG. 2K schematically illustrates the semiconductor device 200 during a further etch process 221 in which the hard mask 205 (see FIG. 2J) may be selectively removed with respect to the layer 204 and the residues of the materials 212A, 212B. Thereafter, the layer 204 and the materials 212A, 212B may be removed on the basis of highly selective etch techniques for which a plurality of recipes are well established in the art. For example, a plurality of wet chemical etch recipes are available for selectively removing silicon dioxide with respect to silicon, Si/Ge and the like.

Figure 2L:
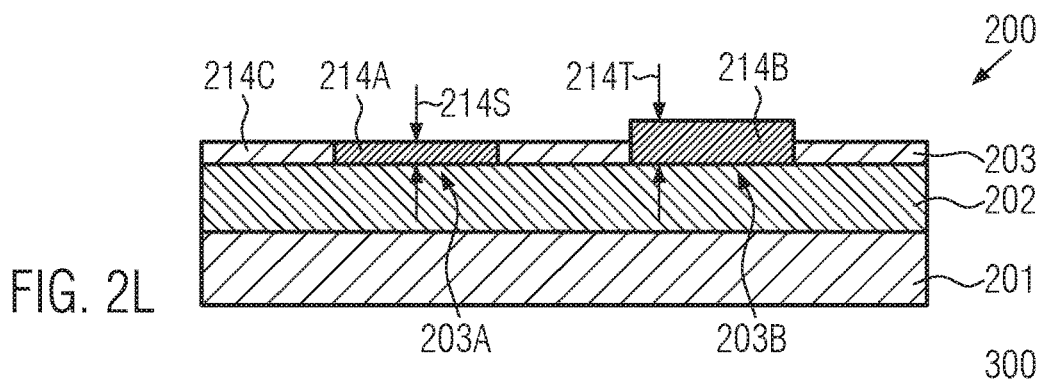

FIG. 2L schematically illustrates the semiconductor device 200 after completing the above-described process sequence. Hence, the semiconductor device 200 may include the first and second active regions 214A, 214B, still requiring appropriate lateral delineation, as discussed above, having different germanium concentrations. That is, the first active region 214A may have an appropriate "low" germanium concentration of approximately 10-18 at % germanium, while the second active region 214B may have a "high" germanium concentration of approximately 19-30 at % germanium. In some illustrative embodiments, the difference of the Ge concentrations of the first and second active regions 214a, 214B may be in the range of 2-10 at %. Any other germanium concentration may be selected in other embodiments in accordance with device requirements, if appropriate. Furthermore, due to the preceding common "condensation" process 211 (see FIG. 2I), the thickness of the active region 214A, indicated by 214S, may be less than a thickness 214T of the active region 214B. Moreover, at least one third type of active region 214C may be provided in the remaining portion of the semiconductor layer 203, in which the initial state of the semiconductor layer 203 may have been preserved.

Also in this case, the further processing may be continued by appropriately preparing the respective active regions 214A, 214B, 214C by incorporating dopant species, if required, and a lateral delineation may be accomplished so as to actually dimension the respective active regions, for instance, by forming respective isolation regions on the basis of complex patterning strategies.

With reference to FIGS. 3A-3I, further illustrative embodiments will now be described in more detail in which an appropriate adjustment of layer thickness of a selectively grown Si/Ge mixture may be achieved by applying at least one masked condensation process.

Figure 3A:
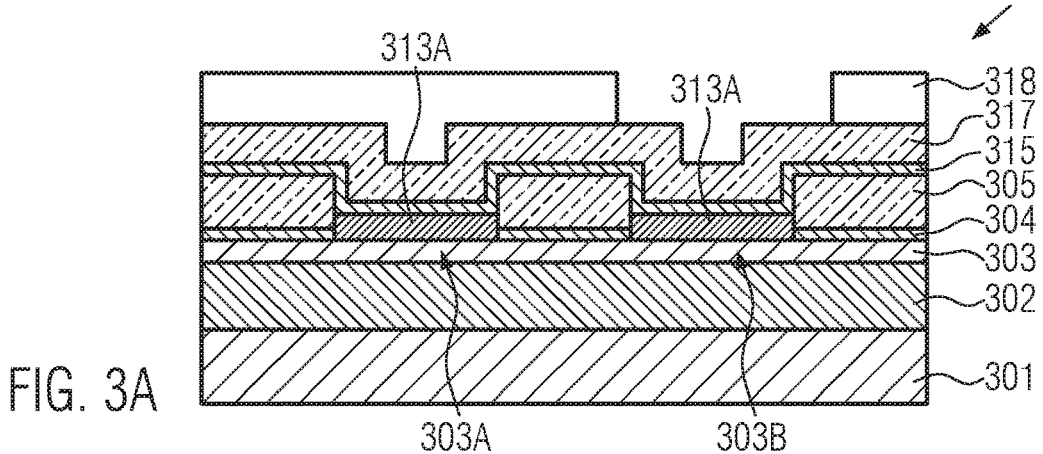
FIGS. 3A-3I schematically illustrate cross-sectional views of a semiconductor device during various manufacturing stages in forming different types of active regions, including crystalline Si/Ge mixtures of different germanium concentrations obtained on the basis of separate epitaxial growth processes and a masked thermal "condensation" process according to illustrative embodiments, wherein, in some illustrative embodiments, a substantially identical thickness of the Si/Ge mixtures of different germanium concentration may be obtained.

FIG. 3A schematically illustrates a semiconductor device 300 in a moderately advanced manufacturing stage, which may basically correspond to the manufacturing stage of the semiconductor device 200 as shown in FIG. 2E. Consequently, for any components of the device 300 and for any process technique for forming any such components, the same criteria may apply as also discussed above for the semiconductor device 200. In particular, the semiconductor device 300 may include a substrate 301, an optional buried insulating layer 302, a semiconductor layer including a high amount of silicon 303, a protective layer 304, a patterned hard mask layer 305, a further etch stop layer 315 and a further hard mask layer 317, wherein the layers 315 and 317 may be formed so as to cover respective regions 303A, 303B having formed thereon a first Si/Ge mixture 313A with a desired germanium concentration or germanium concentration gradient and a specified layer thickness. Moreover, an etch mask 318 may be formed above the layer 317 and may be patterned so as to reliably expose the region 303B and any layers formed thereabove.

With respect to process strategies for forming the semiconductor device 300 as shown in FIG. 3A, reference may be made to the process sequence as described in the context of FIGS. 2A-2E when referring to the semiconductor device 200.

Figure 3B:
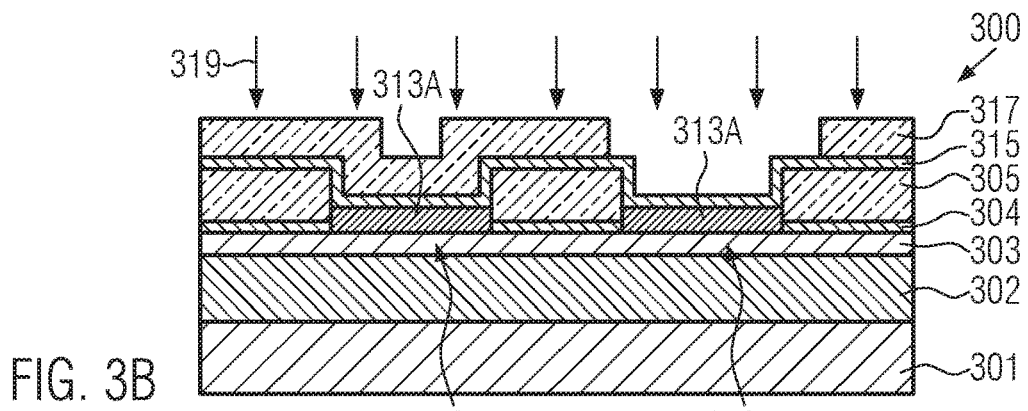

FIG. 3B schematically illustrates the semiconductor device 300 during an etch process 319 in which the hard mask layer 317 may be patterned in accordance with the etch mask 318 (see FIG. 3A), wherein the layer 315 may act as an etch stop material. Thereafter, exposed portions of the etch stop layer 315 may be removed on the basis of appropriate selective etch recipes, as also discussed above in the context of the semiconductor device 200, while using the patterned hard mask 317 as an etch mask. Consequently, during the respective process sequence, the material 313A formed above the second region 303B may be exposed. Next, an exposed surface (not shown) of the material 313A may be prepared for a selective epitaxial growth process based on any well-established process recipes.

Figure 3C:
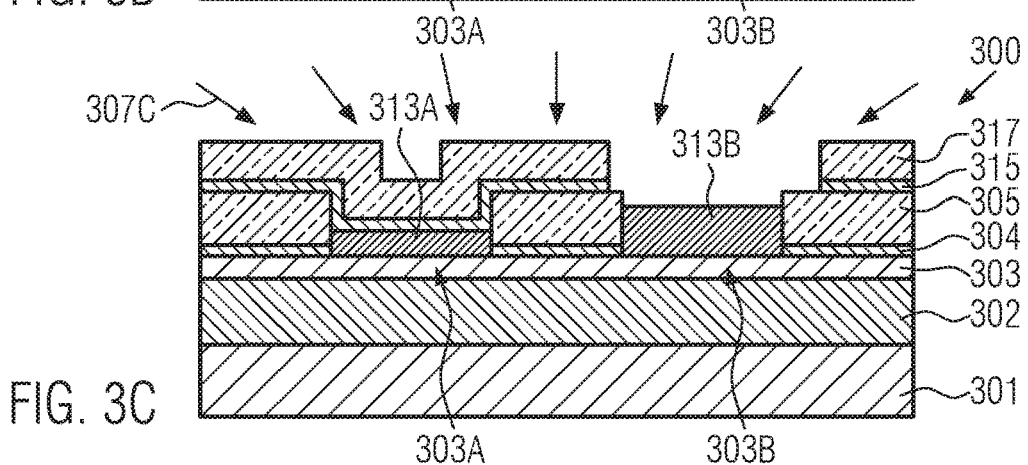

FIG. 3C schematically illustrates the semiconductor device 300 during a further selective growth process 307C in order to form a second Si/Ge mixture 313B, which, in combination with the previously grown material 313A may, thus, form the second Si/Ge material and may be referred to by the same reference numeral 313B. With respect to any process parameters, reference may also be made to the devices 100 and 200 in order to provide the material 313B with desired germanium concentration or concentration gradient and layer thickness. In some embodiments, at least the upper portion of the material 313B may have an increased germanium concentration compared to the previously grown material 313A.

Figure 3D:
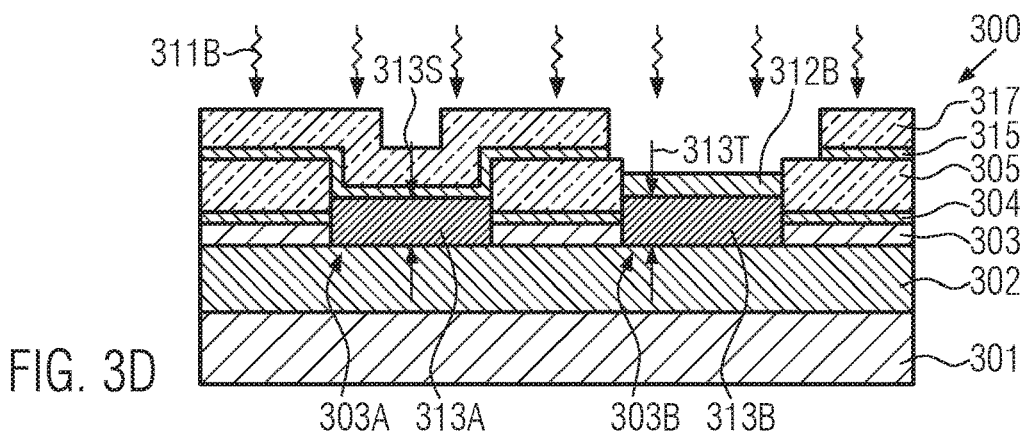

FIG. 3D schematically illustrates the semiconductor device 300 during a first condensation process 311B established in an oxidizing ambient with a sufficiently high temperature so as to continuingly oxidize the second Si/Ge material 313B and to form an oxide material 312B, thereby increasingly driving preferably germanium species into region 303B. In some illustrative embodiments, the first condensation process 311B may be adjusted, for instance, by selecting an appropriate temperature and/or an oxygen concentration and/or a process time for appropriately adjusting a thickness 313T of the resulting Si/Ge material 313B. That is, by appropriately controlling the formation of the oxidized material 312B during the process 311B, the initial thickness of the material 313B may be increasingly reduced so as to achieve a desired target thickness in accordance with device requirements. In some illustrative embodiments, the final thickness 313T of the material 313B may be adjusted so as to substantially correspond to a thickness 313S of the material system formed by the first Si/Ge material 313A and the initial region 303A. In this manner, substantially identical layer thickness values may be obtained for the further processing of the semiconductor device 300, which may finally result in active regions including Si/Ge material of substantially equal thickness. It should be noted that the region 303A also condenses, however, without forming oxide due to the presence of mask layer 317, this means that the channel thickness corresponds to the combination of the initial region 303A and material 313A, wherein Ge is pushed down into the region 303A, thereby obtaining a relatively even distribution of Ge.

In other illustrative embodiments, the first condensation process 311B may be applied such that a desired target thickness 313T may be obtained which may be greater than or less than the thickness 313S.

Figure 3E:
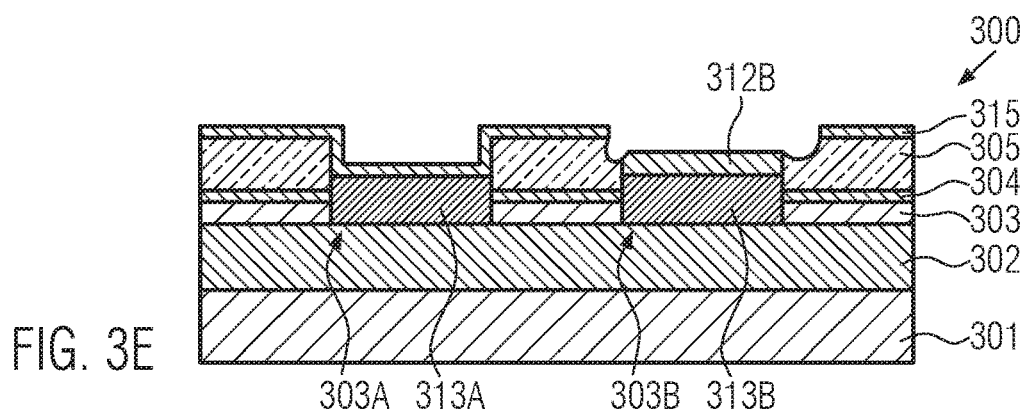

FIG. 3E schematically illustrates the semiconductor device 300 after removal of the hard mask 317 (see FIG. 3D), which may be accomplished on the basis of selective etch recipes. During the corresponding process, the layer 315 may act as a stop material, thereby reliably covering the material 313A. On the other hand, the material 313B in its "pre-condensed" state may be reliably covered by the material 312B. Moreover, as shown, portions of the hard mask layer 305 previously not covered by the layer 315 may experience a certain degree of material erosion, which may be readily taken into consideration upon appropriately selecting the initial thickness of the layer 305, as also discussed above.

Figure 3F:
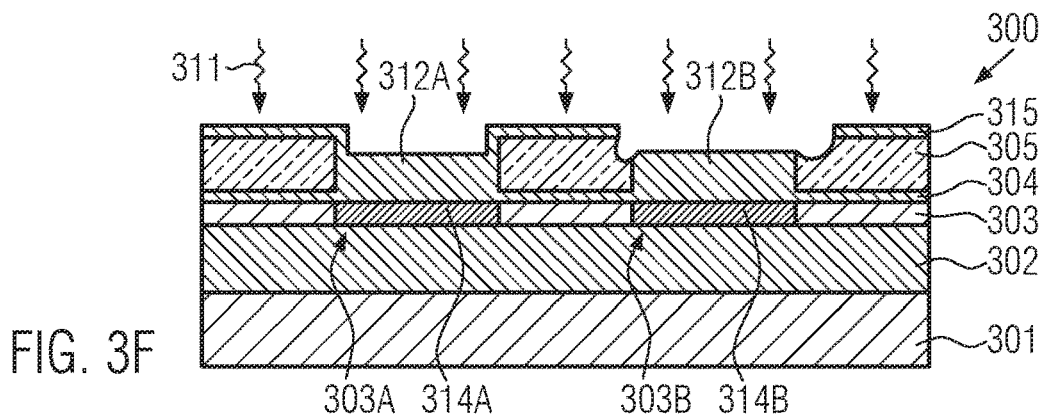

FIG. 3F schematically illustrates the semiconductor device 300 during a further condensation process 311, which may result in the formation of an oxidized material 312A and a further increase of the thickness of the material 312B. The process parameters of the condensation process 311 may be selected so as to meet device requirements, for instance, by oxidizing the previously formed semiconductor material and driving preferably germanium species into the layer 303, thereby forming respective active regions 314A, 314B. For example, the process parameters of the condensation process 311 may be selected so as to obtain the active region 314A with a thickness that substantially corresponds to the thickness of the initial semiconductor layer 303. Depending on the process parameters used in the previously performed condensation process 311B (see FIG. 3D) and the resulting thickness 313T, the active region 314B may be obtained with a desired final target thickness which, in some illustrative embodiments, may correspond substantially to the thickness of the active region 314A, while, in other cases, any other appropriate thickness may be established, depending on the previously adjusted thickness 313T, as discussed above.

Figure 3G:
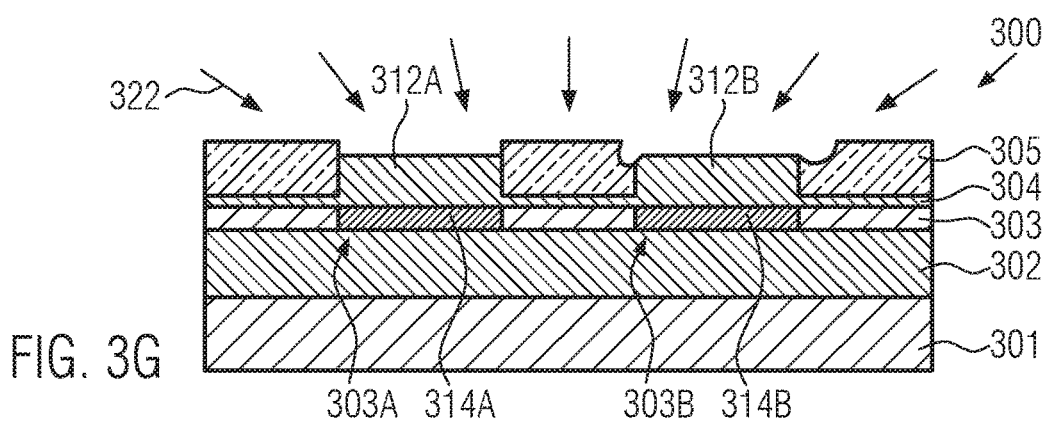

FIG. 3G schematically illustrates the semiconductor device 300 during a further removal process 322 in which the etch stop layer 315 (see FIG. 3F) and a certain portion of the oxidized materials 312A, 312B may be removed. To this end, well-established selective etch recipes, wet chemical or plasma-assisted, may be applied.

Figure 3H:
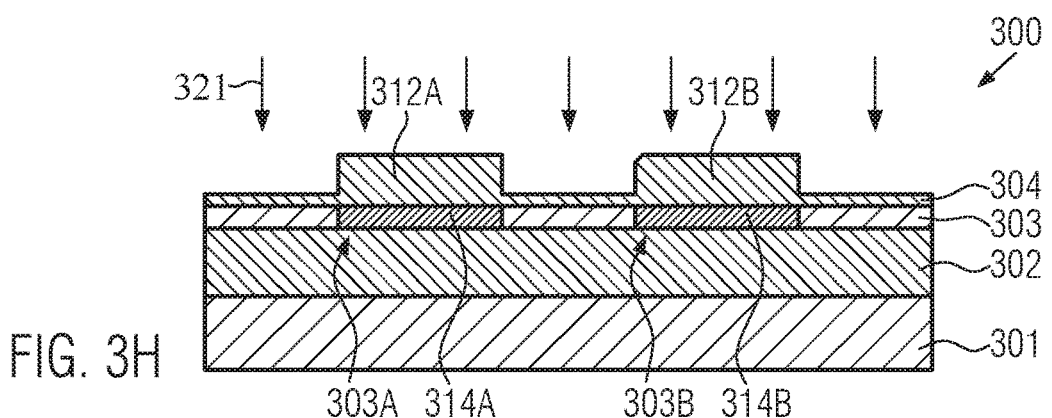

FIG. 3H schematically illustrates the semiconductor device 300 during a further etch process 321 in which the hard mask layer 305 (see FIG. 3G) may be selectively removed to the etch stop layer 304 and the oxidized materials 312A, 312B.

Figure 3I:
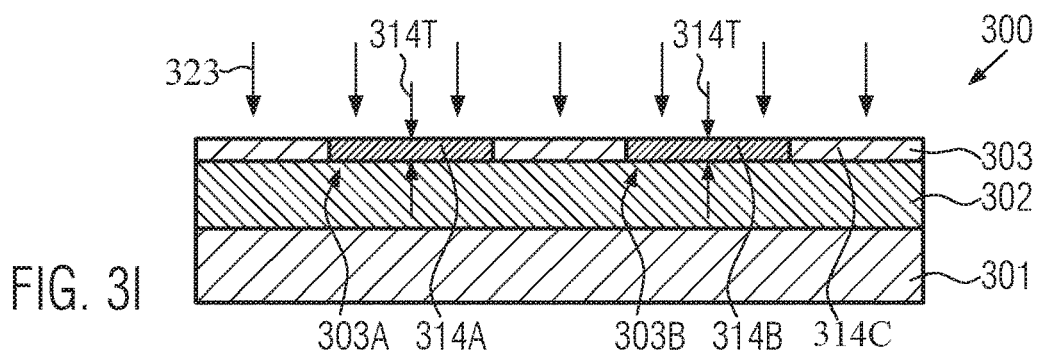

FIG. 3I schematically illustrates the semiconductor device 300 when exposed to a further etch ambient 323 that is appropriately designed to remove the layer 304 and the materials 312A, 312B (see FIG. 3H) selectively with respect to the semiconductor layer 303 and the active regions 314A, 314B. To this end, appropriate selective etch recipes are well established in the art.

As illustrated, the active regions 314A, 314B may be provided with an Si/Ge mixture of different germanium concentration and may have a final thickness 314T which may, in some illustrative embodiments, be substantially identical, depending on the previously adjusted thickness 313T of the material 313B (see FIG. 3D), as discussed above. When providing substantially the same thickness 314T for both Si/Ge-containing active regions 314A, 314B, superior process conditions may be achieved due to a less pronounced surface topography during the further processing.

Moreover, a respective active region 314C may be provided in the form of the previously non-modified portion of the semiconductor layer 303.

Also in this case, it is to be noted that the actual lateral dimensions of the active regions 314A, 314B, 314C may be defined in a subsequent process sequence.

In other illustrative embodiments, the concept of a "pre-condensation" of the Si/Ge material having the increased thickness and/or germanium concentration may be applied to embodiments such as, for instance, discussed above in the context of the semiconductor device 100. For example, when referring to the semiconductor device 100 as shown in FIG. 1K, a respective hard mask may be formed, for instance, as shown in FIG. 3C, thereby exposing the material 113B of FIG. 1K and reliably covering the material 113A of FIG. 1K. Thereafter, a pre-condensation process, such as the process 311B shown in FIG. 3D, may be applied so as to oxidize a desired portion of the material 113B of FIG. 1K and, thus, driving preferably germanium species into the lower lying region 103B until a desired target thickness for the material 113B is obtained. It should be noted that the region 113A also condenses, however, without forming oxide, wherein Ge is pushed down into the region 103A, thereby obtaining a relatively even distribution of Ge. Thereafter, the respective hard mask, such as the mask 317 and 305, may be removed, as is, for instance, discussed in the context of FIG. 3E, followed by a further condensation process, such as the process 111 in FIG. 1L, thereby obtaining the respective active regions 114A, 114B with a desired target thickness, for example the active regions 114A, 114B may have substantially the same thickness while differing in germanium concentration.

In other illustrative embodiments, the semiconductor device 100 as shown in FIG. 1L may be used as a starting point for a further condensation process, wherein the active region 114A of FIG. 1L may be covered by a hard mask, while the active region 114B may be exposed to a further condensation process, thereby further oxidizing material of the active region 114B until a desired target thickness may be achieved. Thereafter, the respective hard mask may be removed, as is also discussed in the context of the semiconductor device 300.

As a consequence, applying at least one masked condensation process in combination with a commonly performed condensation process may result in superior process flexibility in obtaining a target thickness for two different types of active regions having included therein an Si/Ge material.

Moreover, although the processes for semiconductor devices described above in the context of the semiconductor devices 100, 200 and 300 may provide for two different types of active regions, including an Si/Ge mixture in combination with at least one further type of active region without an Si/Ge mixture, it is to be noted that, in other illustrative embodiments, more than two different types of active regions with Si/Ge material incorporated therein may be provided by appropriately extending the masking regime described above, if more than two different germanium concentrations may be required in Si/Ge-containing active regions.

Figure 4A:
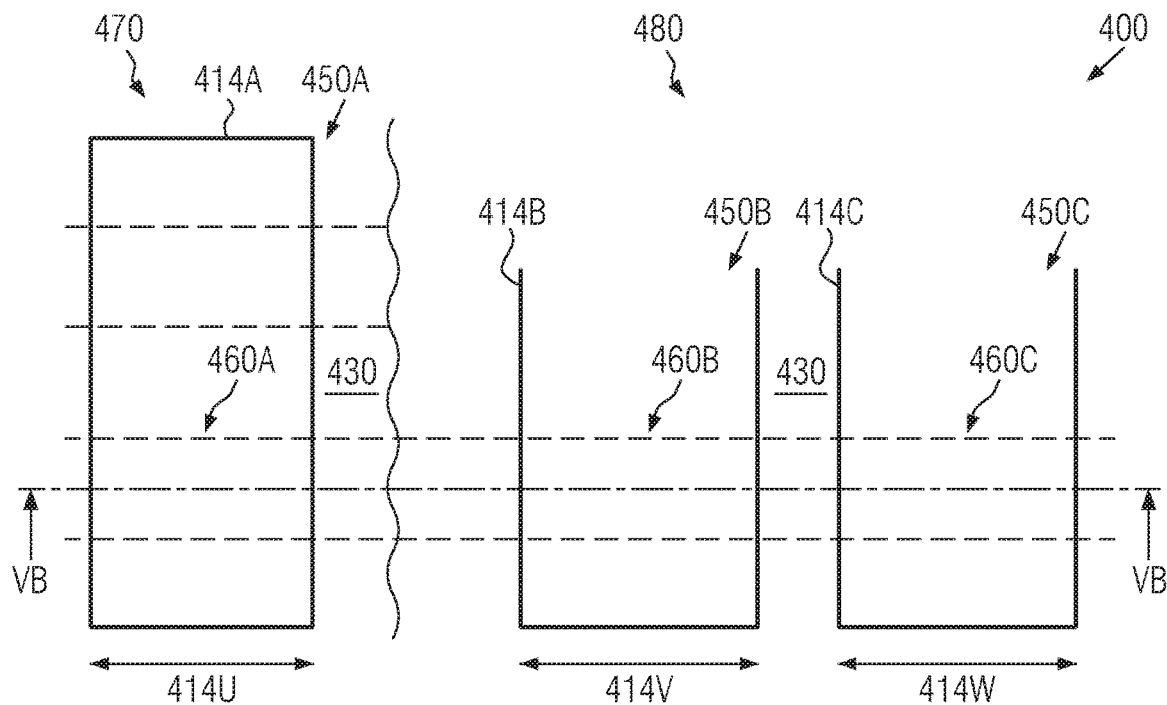
FIGS. 4A and 4B illustrate a top view (FIG. 4A) and a cross-sectional view (FIG. 4B) of a semiconductor device including different types of active regions and respective transistor elements formed on the basis of these different active regions, according to still further embodiments.

FIG. 4A schematically illustrates a top view of a semiconductor device 400 in a manufacturing stage in which respective active regions 414A, 414B, 414C may be provided in a laterally delineated state. In some illustrative embodiments, the active region 414A may be provided in a first device region 470, which may correspond to a device region including a plurality of RAM cells. Consequently, the active region 414A may correspond to a part of a RAM cell for forming respective transistor elements 450A, for instance, in the form of pull-up transistors and the like. As is well known, the current-carrying capacity of respective transistors 450A in a RAM cell may be specifically designed so as to comply with the overall device requirements and may be adjusted for a given transistor configuration mainly on the basis of the transistor width, which may correspond to a width dimension 414U of the respective active region 414A. In some illustrative embodiments of sophisticated semiconductor devices, the width 414U may be formed on the basis of a design width of 60 nm and even significantly less. It should be appreciated that the active region 414A may be formed on the basis of any of the active regions 114A, 214A, 314A as previously discussed in the context of the semiconductor devices 100, 200 and 300, wherein an Si/Ge material may be typically incorporated in the active region 414A with a specific "low" germanium concentration, as discussed above.

The semiconductor device 400 may include, for instance, in the device region 470, the further active region 414C which may be formed on the basis of a silicon material, a silicon/carbon material and the like, which may, for instance, meet the requirements for logic transistor elements, such as N-type transistors and the like. Thus, one or more respective transistor elements 450C may be formed in and on the active region 414C having an appropriate width 414W in order to obtain the required transistor performance.

Furthermore, the semiconductor device 400 may include a second device region 480 in which transistor elements may have to be provided with increased current-carrying capacity and high switching speed, which may typically require an increased transistor width compared to the transistor elements 450A in the device region 470. As illustrated, an active region 414B may be provided so as to have a width 414V that is appropriate for forming one or more transistor elements 450B, such as P-type transistors, meeting the requirements for sophisticated logic devices. Typically, the width 414V may be significantly greater than the width 414U of, for instance, a pull-up transistor in a RAM cell. The active region 414B may be obtained on the basis of the active regions 114B, 214B, 314B and may have a higher germanium concentration in a respective Si/Ge material compared to the active region 414A, as also discussed above.

Additionally, the semiconductor device 400 may include, for instance, in the device region 480, a further active region 414C which may be formed on the basis of a silicon material, a silicon/carbon material and the like, which may, for instance, meet the requirements for logic transistor elements, such as N-type transistors and the like. Thus, one or more respective transistor elements 450C may be formed in and on the active region 414C having an appropriate width 414W in order to obtain the required transistor performance.

It should be appreciated that, for convenience, the respective transistor elements 450A, 450B, 450C are schematically illustrated by only indicating respective gate electrode structures 460A, 460B, 460C, while other transistor components, such as drain and source regions, are not specifically shown in FIG. 4A.

The respective active regions 414A, 414B, 414C may be delineated by respective isolation regions 430, for instance, provided in the form of trench isolations and the like.

Figure 4B:
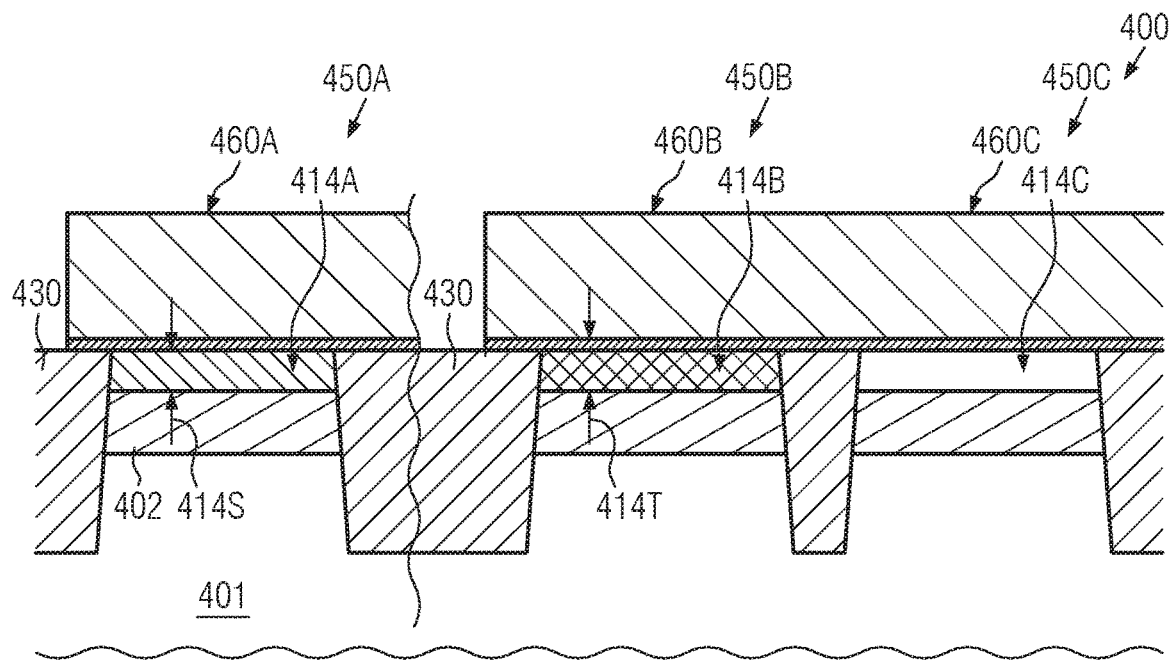

FIG. 4B schematically illustrates a cross-sectional view of the semiconductor device 400 along a line indicated as VB in FIG. 4A. As illustrated, the transistor 450A, including the gate electrode structure 460A, which may have any appropriate configuration, may be formed in and on the active region 414A having a specific thickness 414S which, in some illustrative embodiments, may correspond to a substantially fully depleted configuration. For example, the portion of the active region 414A as illustrated in the section of FIG. 4B may correspond to a central portion of a respective channel region, wherein a current flow direction may be perpendicular to the drawing plane of FIG. 4B. As discussed above in the context of FIG. 4A, the width 414U may be defined by the respective isolation regions 430 and may, thus, determine, among other things, the finally obtained current-carrying capacity. Moreover, transistor characteristics, such as threshold voltage and the like, may be appropriately adapted on the basis of the Si/Ge material in the active region 414A having a desired germanium concentration, as discussed above.

Similarly, the transistor(s) 450B may include the active region 414B having implemented therein the Si/Ge material with a specified concentration that may be higher than the germanium concentration of the active region 414A so as to comply with the requirements of transistor elements to be used in critical signal paths and the like. Similarly, as discussed above, the width 414V of the active region 414B and, thus, the respective transistor width, may also be selected in view of a required current-carrying capacity. Moreover, as discussed above, the thickness 414T of the active region 414B below the respective gate electrode structure 460B may be adjusted in accordance with device requirements and, in some illustrative embodiments, may be substantially equal to the thickness 414S of the channel region or active region 414A below the gate electrode structure 460A. In this respect, a substantially equal thickness is to be understood such that the thickness 414T corresponds to ±3 nm of the thickness 414S of the active region 414A.

Furthermore, the transistor element(s) 450C may be provided on the basis of the active region 414C, for instance, provided without Si/Ge mixture and having the appropriate width 414W so as to comply with the requirements of logic transistor elements in the form of an N-type transistor element. It should be appreciated that a thickness of the active region 414C may also be substantially identical to the thickness values of at least one of the active regions 414A, 414B.

The semiconductor device 400 as shown in FIGS. 4A and 4B may be formed on the basis of process techniques previously discussed in the context of the semiconductor devices 100, 200 and 300 in order to obtain respective active regions which may still require a precise lateral bordering on the basis of the isolation regions 430. Consequently, after having formed the respective active regions, such as 114A-114C, 214A-214C, 314A-314C, the further processing may be continued by incorporating dopant species into the respective active regions and possibly into a portion of a substrate material 401, depending on the overall transistor configuration. Furthermore, as already discussed above, in some illustrative embodiments, a buried insulating layer 402 may be formed below at least some of the active regions 414A-414C in order to provide an SOI architecture.

Thereafter, a complex process sequence may be applied in order to form the isolation regions 430, which may require the patterning of the previously established coarsely delineated active regions in one lateral direction, for instance, in the width direction, thereby obtaining the respective required width dimensions 414U, 414V, 414W, followed by a further sequence for delineating the respective active regions 414A-414C in a length direction, i.e., in FIG. 4A, the vertical direction, and, in FIG. 4B, the direction perpendicular to the drawing plane of FIG. 4B. The respective patterning sequence may require highly sophisticated techniques in order to provide, in particular, the active region 414A with the required small width dimension 414U of approximately 60 nm and even less. In other cases, the respective dimensions of the active regions 414A-414C may be selected in accordance with less critical requirements when less critical semiconductor devices are considered.

Thereafter, the gate electrode structures 460A-460C may be formed in accordance with well-established techniques, followed by the formation of drain and source regions, which, in some illustrative embodiments, may be formed on the basis of a raised drain and source architecture in sophisticated applications.

Consequently, the transistors 450A, 450B may be basically formed with a very similar configuration, yet differing in lateral size and, in particular, in a germanium concentration of the respective Si/Ge mixture provided in the active regions 414A, 414B. In this manner, in addition to appropriately selecting lateral dimensions of transistor elements, in particular, a respective transistor width, the capability of implementing different germanium concentrations in active regions that require an Si/Ge mixture may add an additional degree of freedom in designing and forming complex integrated circuits, such as circuits including a static RAM area requiring minimum transistor width dimensions of 60 nm and even less. In other cases, less critical semiconductor devices may also be formed on the basis of active regions having incorporated therein Si/Ge mixtures of different germanium concentration, thereby also relaxing respective constraints in forming any such semiconductor devices. Moreover, as also discussed above, in some illustrative embodiments, the Si/Ge material in different types of active regions may also differ in layer thickness, thereby also providing an additional degree of freedom in adjusting transistor characteristics, if considered appropriate. In other cases, the active regions of different germanium concentration may have substantially the same thickness, thereby avoiding pronounced surface topography, which may be of advantage when patterning extremely densely packed device regions, such as static RAM regions.

The particular embodiments disclosed above are illustrative only, as the subject matter defined by the appended claims may be modified and practiced in different but equivalent manners apparent to those skilled in the art having the benefit of the teachings herein. For example, some or all of the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the claimed subject matter. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising:
    a first transistor element comprising a first channel region, said first channel region comprising a first crystalline silicon/germanium (Si/Ge) material mixture having a first germanium concentration;
    a second transistor element comprising a second channel region, said second channel region comprising a second crystalline Si/Ge material mixture having a second germanium concentration that is higher than said first germanium concentration; and
    a third transistor element comprising a third channel region, wherein said third channel region comprises a third crystalline semiconductor material having a lower germanium concentration than said first and second germanium concentrations.

2. The semiconductor device of claim 1, wherein said second germanium concentration is higher than said first germanium concentration by approximately 2-10 atomic percent.

3. The semiconductor device of claim 1, wherein said first germanium concentration is in a range of approximately 10-18 atomic percent and said second germanium concentration is in a range of approximately 19-30 atomic percent.

4. The semiconductor device of claim 1, wherein said first channel region is formed in a first active region having a first thickness and said second channel region is formed in a second active region having a second thickness that is greater than said first thickness.

5. The semiconductor device of claim 1, wherein said first channel region is formed in a first active region having a first thickness and said second channel region is formed in a second active region having a second thickness that is substantially equal to said first thickness.

6. The semiconductor device of claim 1, wherein a width of said first active region is approximately 60 nm or less.

7. The semiconductor device of claim 1, wherein at least one of said first transistor element and said second transistor element is a fully depleted semiconductor-on-insulator (SOI) transistor element.

8. A semiconductor device, comprising:
    a substrate;
    a buried insulating layer positioned above said substrate;
    a semiconductor material layer positioned above said buried insulating layer;
    a first active region formed in said semiconductor material layer, wherein said first active region has a first region thickness and comprises a first crystalline silicon/germanium (Si/Ge) material mixture having a first germanium concentration;
    a first transistor element formed in and above said first active region;
    a second active region formed in said semiconductor material layer, wherein said second active region has a second region thickness and comprises a second crystalline Si/Ge material mixture having a second germanium concentration that is higher than said first germanium concentration;
    a second transistor element formed in and above said second active region;
    a third active region formed in said semiconductor material layer, wherein said third active region has a third region thickness that is substantially the same as at least one of said first and second thicknesses, and wherein said third active region comprises a third crystalline material having a germanium concentration that is lower than said first and second germanium concentrations; and a third transistor element formed in and above said third active region.

9. The semiconductor device of claim 8, wherein said first and second active regions are laterally delineated by an isolation region extending through at least said semiconductor material layer.

10. The semiconductor device of claim 8, wherein said second germanium concentration is higher than said first germanium concentration by approximately 2-10 atomic percent.

11. The semiconductor device of claim 8, wherein said first germanium concentration is in a range of approximately 10-18 atomic percent and said second germanium concentration is in a range of approximately 19-30 atomic percent.

12. The semiconductor device of claim 8, wherein a width of said first active region is approximately 60 nm or less.

13. The semiconductor device of claim 8, wherein at least one of said first transistor element and said second transistor element is a fully depleted transistor element.

14. The semiconductor device of claim 8, wherein said second thickness is greater than said first thickness.

15. The semiconductor device of claim 8, wherein said second thickness is substantially equal to said first thickness.

16. A semiconductor device, comprising:
- a semiconductor-on-insulator (SOI) substrate comprising a base substrate material, a buried insulating layer positioned above said base substrate material, and a semiconductor material layer positioned above said buried insulating layer;
- a first active region formed in said semiconductor material layer, said first active region having a first region thickness and comprising a first crystalline silicon/germanium (Si/Ge) material mixture having a first germanium concentration;
- a first transistor element formed in and above said first active region;
- a second active region formed in said semiconductor material layer, said second active region having a second region thickness that is substantially equal to or greater than said first region thickness and comprising a second crystalline Si/Ge material mixture having a second germanium concentration that is higher than said first germanium concentration by at least approximately 2-10 atomic percent;
- a second transistor element formed in and above said second active region;
- a third active region formed in said semiconductor material layer, said third active region having a third region thickness that is substantially the same as at least one of said first and second thicknesses, wherein said third active region comprises a third crystalline material having a lower germanium concentration than said first and second germanium concentrations; and
- a third transistor element formed in and above said third active region.

17. The semiconductor device of claim 16, wherein said first germanium concentration is in a range of approximately 10-18 atomic percent and said second germanium concentration is in a range of approximately 19-30 atomic percent.

18. The semiconductor device of claim 16, wherein at least one of said first, second, and third transistor elements is a fully depleted transistor element.

19. The semiconductor device of claim 16, wherein a width of said first active region is approximately 60 nm or less.

20. The semiconductor device of claim 16, wherein said first active region and said second active region are laterally delineated by an isolation region extending through at least said semiconductor material layer.

* * * * *